United States Patent
Tateshita

(10) Patent No.: US 8,614,412 B2
(45) Date of Patent: Dec. 24, 2013

(54) SOLID-STATE IMAGE DEVICE, MANUFACTURING METHOD THEREOF, AND IMAGE CAPTURING APPARATUS

(71) Applicant: Sony Corporation, Tokyo (JP)

(72) Inventor: Yasushi Tateshita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/717,023

(22) Filed: Dec. 17, 2012

(65) Prior Publication Data

US 2013/0105870 A1    May 2, 2013

Related U.S. Application Data

(63) Continuation of application No. 12/656,423, filed on Jan. 29, 2010, now Pat. No. 8,354,631.

(30) Foreign Application Priority Data

Mar. 4, 2009   (JP) ................................ 2009-050131

(51) Int. Cl.
    *H01L 31/00*       (2006.01)
    *H01L 21/70*       (2006.01)

(52) U.S. Cl.
    USPC .......................... 250/214.1; 257/369; 257/290

(58) Field of Classification Search
    USPC ................... 250/214.1; 257/369, 290
    See application file for complete search history.

(56) References Cited

U.S. PATENT DOCUMENTS

| | | | |
|---|---|---|---|
| 7,385,167 B2 * | 6/2008 | Li et al. | 250/208.1 |
| 7,485,517 B2 | 2/2009 | Lee et al. | |
| 8,354,631 B2 * | 1/2013 | Tateshita | 250/214.1 |

| | | | |
|---|---|---|---|
| 2003/0181005 A1 | 9/2003 | Hachimine et al. | |
| 2005/0006565 A1 | 1/2005 | Mouli | |
| 2008/0293194 A1 | 11/2008 | Chen et al. | |

(Continued)

FOREIGN PATENT DOCUMENTS

| | | |
|---|---|---|
| JP | 2003-273240 | 9/2003 |
| JP | 2008-140854 A | 6/2008 |
| JP | 2008-252032 A | 10/2008 |

OTHER PUBLICATIONS

S. Maeda et al., "Impact of Mechanical Stress Engineering on Flicker Noise Characteristics," 2004 Symposium on ULSI Technology Digest of Technical Papers, 2004 IEEE, pp. 102-103, Korea.

European Search Report issued Jul. 15, 2010 for corresponding European Application No. 10 25 0335.

Mayuzumi, S. et al. "Extreme High-Proformance n- and p-MOSFETs Boosted by Dual-Meta/High-K Gate Damamscen Process Using Top-Cut Dual Stress Liners on (100) Substrates" 2007 IEEE International Electron Devices Meeting—IEDM '07 IEEE Piscataway, NJ, USA, 2007, pp. 293-296, XP002589448, ISBN: 978-1-4244-1507-6.

(Continued)

*Primary Examiner* — Thanh Luu
(74) *Attorney, Agent, or Firm* — Rader, Fishman & Grauer PLLC

(57) ABSTRACT

A solid-state image device is provided which includes: a photoelectric conversion portion which obtains a signal charge by photoelectric conversion of incident light; a pixel transistor portion which outputs a signal charge generated by the photoelectric conversion portion; a peripheral circuit portion which is provided at the periphery of a pixel portion including the photoelectric conversion portion and the pixel transistor portion and which has an NMOS transistor and a PMOS transistor; a first stress liner film which has a compressive stress and which is provided on the PMOS transistor; and a second stress liner film which has a tensile stress and which is provided on the NMOS transistor. In the solid-state image device described above, the photoelectric conversion portion, the pixel transistor portion, and the peripheral circuit portion are provided in and/or on a semiconductor substrate.

10 Claims, 23 Drawing Sheets

(56) References Cited

U.S. PATENT DOCUMENTS

2009/0127627 A1    5/2009  Iwasaki et al.
2009/0215221 A1*   8/2009  Yoo et al. .................. 438/97
2009/0215277 A1    8/2009  Lee et al.

OTHER PUBLICATIONS

Japanese Office Action issued Jul. 30, 2013 for corresponding Japanese Application No. 2009-050131.

* cited by examiner

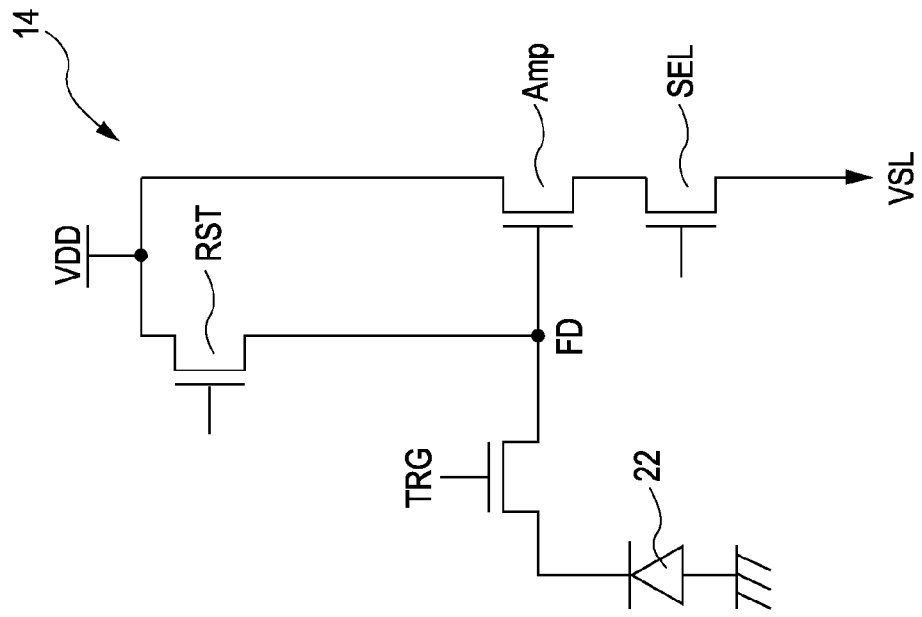
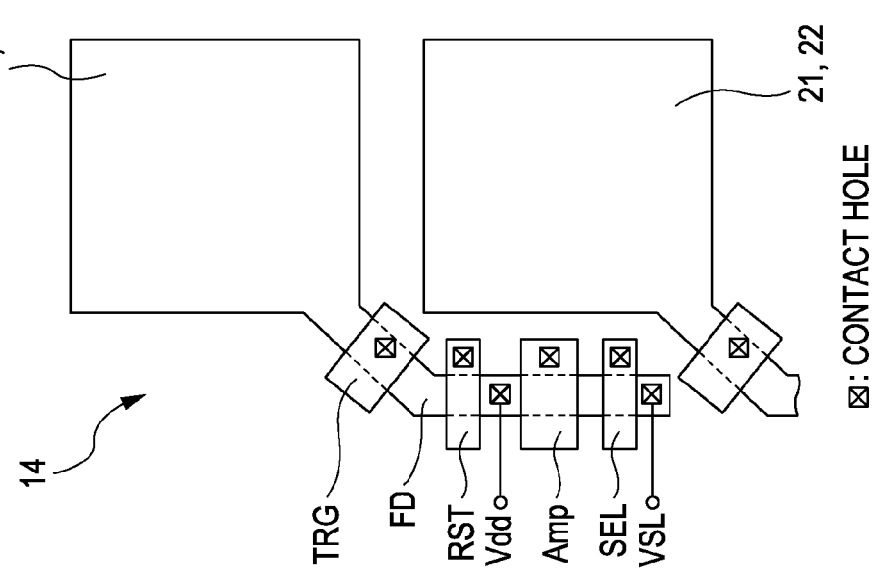

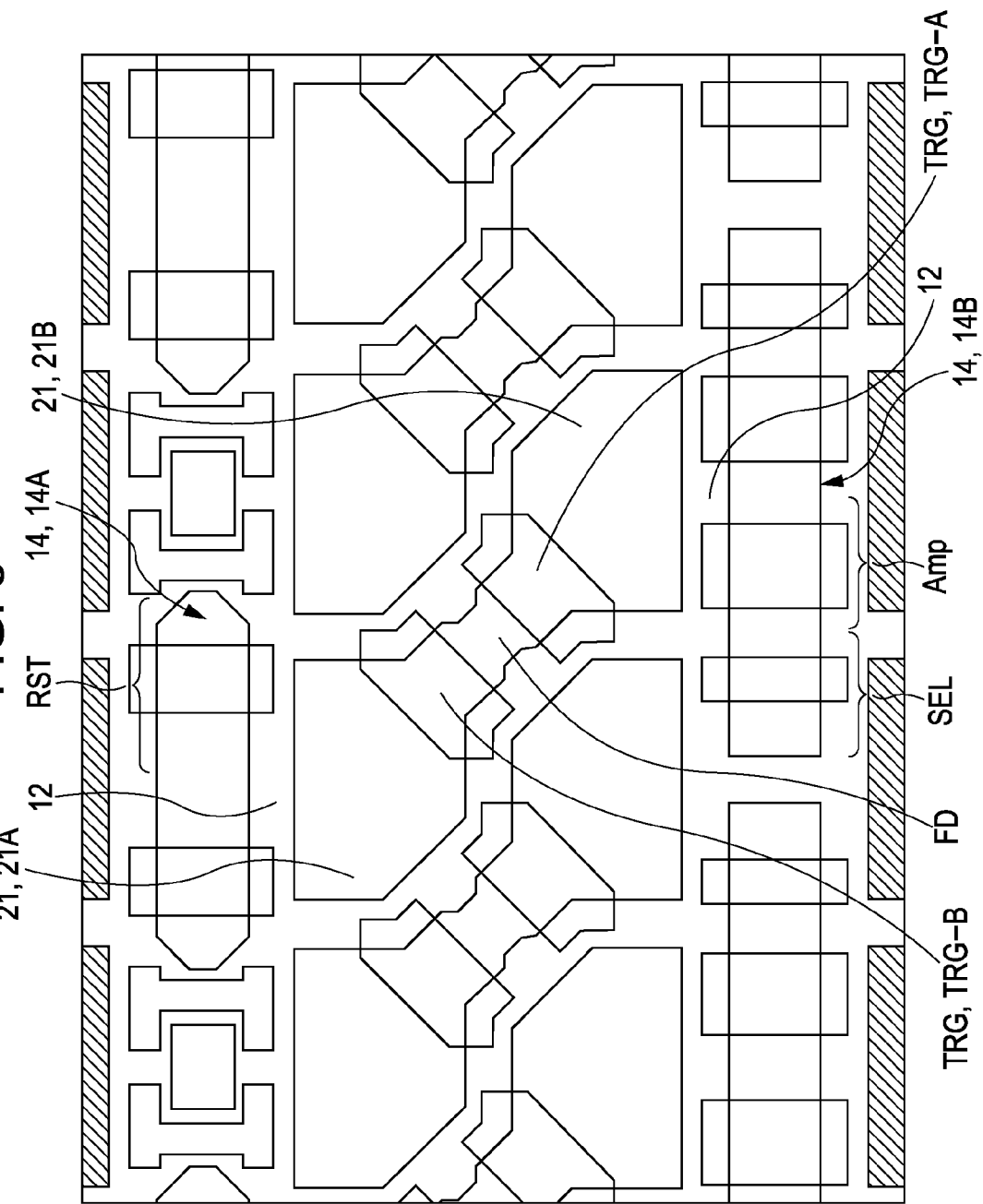

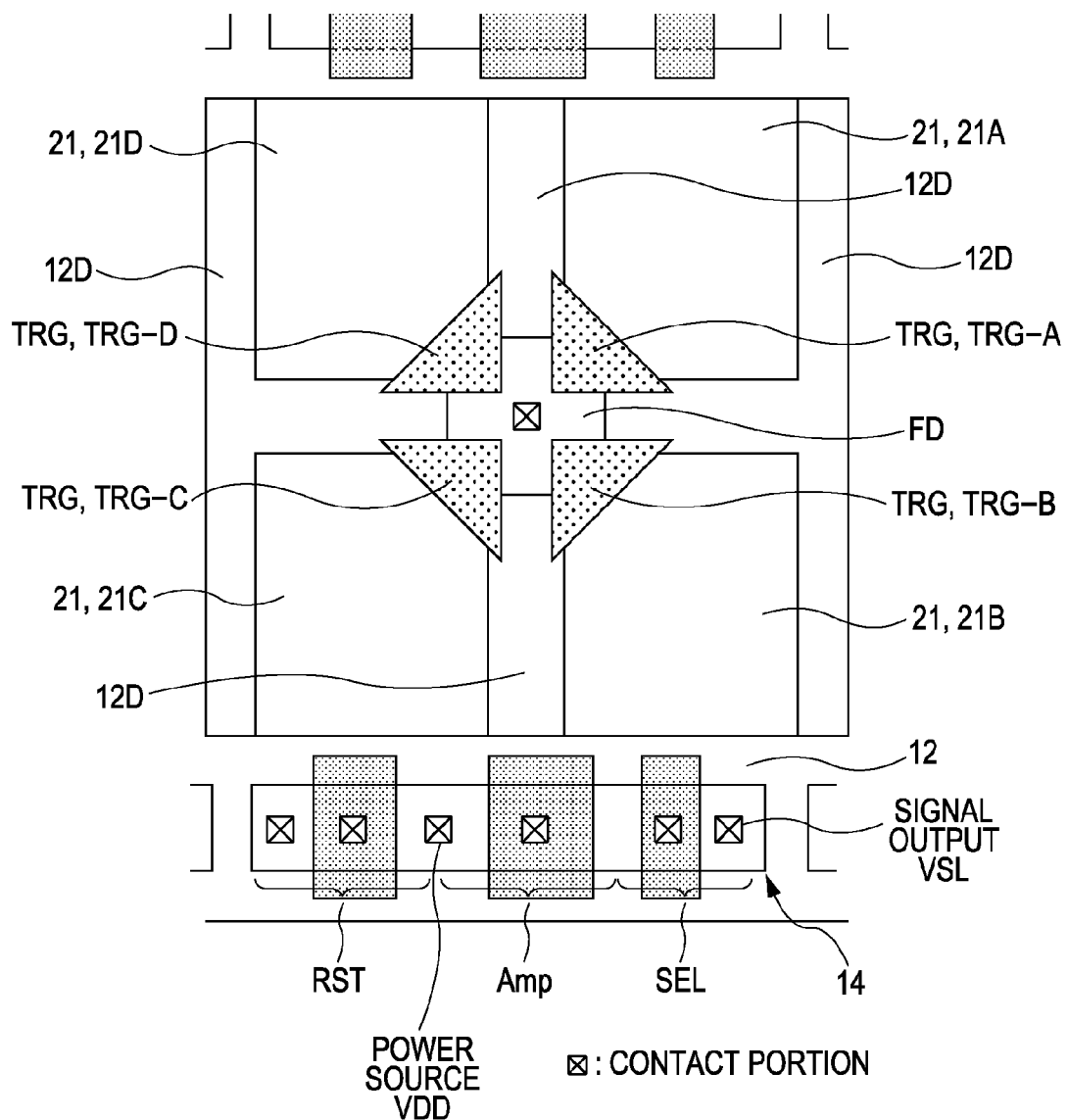

ARROW DIRECTION INDICATING STRESS DIRECTION EFFECTIVE TO MOBILITY IMPROVEMENT

PMOS TRANSISTOR

ARROW DIRECTION INDICATING STRESS DIRECTION EFFECTIVE TO MOBILITY IMPROVEMENT

NMOS TRANSISTOR

SOLID-STATE IMAGE DEVICE, MANUFACTURING METHOD THEREOF, AND IMAGE CAPTURING APPARATUS

CROSS REFERENCES TO RELATED APPLICATIONS

This is a Continuation Application of U.S. patent application Ser. No. 12/656,423, filed Jan. 29, 2010, which claims priority from Japanese Patent Application JP 2009-050131 filed with the Japanese Patent Office on Mar. 4, 2009 the entire contents of which being incorporated herein by reference.

BACKGROUND OF THE INVENTION

1. Field of the Invention

The present invention relates to a solid-state image device, a manufacturing method thereof, and an image capturing apparatus.

2. Description of the Related Art

In recent years, a CMOS image sensor has been widely used for a video camera, a mobile phone, and the like. In addition, since the CMOS sensor can be formed using a CMOS logic-LSI manufacturing process as a base process, power consumption can be decreased as compared to that of a CCD image sensor having a high voltage analog circuit. Furthermore, since the CMOS image sensor can be microfabricated, mass production thereof can be advantageously performed at a low cost. In addition, in a substrate in which the CMOS image sensor is formed, a logic circuit can be incorporated by the same manufacturing process as that of the CMOS image sensor; hence, on-chip fabrication of an image-data processing circuit can also be realized. Accordingly, when the CMOS image sensor is installed together with a digital signal processor (DSP) and/or a static random access memory (SRAM), for example, a mobile-phone camera module can be suitably miniaturized.

For the purpose of microfabrication and increase in operation speed by a CMOS logic process, a stress liner film is used to improve a current drive ability of a transistor. This stress liner film is formed, for example, of a silicon nitride film and has been frequently used from the 65-nm node era (for example, see Japanese Unexamined Patent Application Publication No. 2003-273240).

The stress liner film described above is a film which distorts a channel portion of a transistor by its own stress so as to increase the mobility of an electron or a hole. The direction of stress applied to a PMOS transistor which improves the mobility thereof is shown in FIG. 24A, and the direction of stress applied to an NMOS transistor which improves the mobility thereof is shown in FIG. 24B.

As shown in FIGS. 24A and 24B, the stress direction of the stress liner film for the NMOS transistor does not coincide with that of the stress liner film for the PMOS transistor. For the NMOS transistor, stresses which pull the channel portion in an x direction and a y direction are effective. For the PMOS transistor, a stress which compresses the channel portion in a y direction is effective. As described above, films having internal stresses in opposite directions are effectively used for the respective transistors. The films as described above are called dual stress liner films.

As the process generation advances, development cost is increased, and hence, in order to reduce the cost, it is significantly important to apply existing process techniques and intellectual properties (IP) which are cultivated through the leading edge MOS development to a CMOS image sensor including a peripheral circuit.

However, an increase in flicker noise of a transistor which receives a stress of the stress liner film described above has been reported (for example, see Shigenobu Maeda et al., "Impact of Mechanical Stress Engineering on Flicker Noise Characteristics", 2004 Symposium on VLSI Technology Digest of Technical Papers, pp. 102 to 103, 2004).

When the stress liner film is simply used in the CMOS image sensor, noise is increased in an amplifying transistor which is disposed in a pixel transistor portion to amplify a photoelectric-converted charge signal. Hence, the stress liner film may cause, in some cases, fatal characteristic degradation of a device which is configured to have a lower noise.

Accordingly, besides the stress liner technique which is used in a high-speed MOS logic process, a technique which reduces noise of a CMOS image sensor portion is also desired at the same time.

SUMMARY OF THE INVENTION

The problem to be solved is that the stress liner technique used in a high-speed MOS logic process and the technique which reduces noise of a CMOS image sensor portion are difficult to be realized at the same time.

Hence, it is desirable when the stress liner technique used in a high-speed MOS logic process and the technique which reduces noise of a CMOS image sensor portion can be realized at the same time.

According to an embodiment of the present invention, there is provided a solid-state image device which includes: a photoelectric conversion portion which obtains a signal charge by photoelectric conversion of incident light; a pixel transistor portion which outputs a signal charge generated by the photoelectric conversion portion; a peripheral circuit portion which is provided at the periphery of a pixel portion including the photoelectric conversion portion and the pixel transistor portion and which has an NMOS transistor and a PMOS transistor; a first stress liner film which has a compressive stress and which is provided on the PMOS transistor; and a second stress liner film which has a tensile stress and which is provided on the NMOS transistor. In the solid-state image device described above, the photoelectric conversion portion, the pixel transistor portion, and the peripheral circuit portion are provided in and/or on a semiconductor substrate.

In the solid-state image device according to an embodiment of the present invention, since the first stress liner film having a compressive stress is formed on the PMOS transistor, the compressive stress of the first stress liner film can be applied to the channel region of the PMOS transistor. Hence, the mobility of the PMOS transistor is improved. In addition, since the second stress liner film having a tensile stress is formed on the NMOS transistor, the tensile stress of the second stress liner film can be applied to the channel region of the NMOS transistor. Hence, the mobility of the NMOS transistor is improved.

On the other hand, the first stress liner film and the second stress liner film are not formed on the photoelectric conversion portion and the pixel transistor portion, noise caused by the stress liner film, such as flicker noise, is not generated. As a result, degradation in image quality caused by noise can be suppressed.

According to an embodiment of the present invention, there is provided a method for manufacturing a solid-state image device which includes the steps of: forming a photoelectric conversion portion which obtains a signal charge by photoelectric conversion of incident light, a pixel transistor portion which outputs a signal charge generated by the photoelectric conversion portion, and a peripheral circuit portion which is formed at the periphery of a pixel portion including the photoelectric conversion portion and the pixel transistor portion and which has an NMOS transistor and a PMOS transistor; forming a first stress liner film having a compressive stress on the PMOS transistor; and forming a second stress liner film having a tensile stress on the NMOS transistor. In the manufacturing method described above, the photoelectric conversion portion, the pixel transistor portion, and the peripheral circuit portion are formed in and/or on a semiconductor substrate.

In the method for manufacturing a solid-state image device according to an embodiment of the present invention, since the first stress liner film having a compressive stress is formed on the PMOS transistor, the compressive stress of the first stress liner film can be applied to the channel region of the PMOS transistor. Hence, the mobility of the PMOS transistor is improved. In addition, since the second stress liner film having a tensile stress is formed on the NMOS transistor, the tensile stress of the second stress liner film can be applied to the channel region of the NMOS transistor. Hence, the mobility of the NMOS transistor is improved.

On the other hand, the first stress liner film and the second stress liner film are not formed on the photoelectric conversion portion and the pixel transistor portion, noise caused by the stress liner film, such as flicker noise, is not generated. As a result, degradation in image quality caused by noise can be suppressed.

According to an embodiment of the present invention, there is provided an image capturing apparatus which includes: a light condensing optical portion which condenses incident light; an image capturing portion including a solid-state image device in which light condensed by the light condensing optical portion is received and is photoelectric-converted; and a signal processing portion processing a photoelectric-converted signal. In the image capturing apparatus described above, the solid-state image device includes: a photoelectric conversion portion which obtains a signal charge by photoelectric conversion of incident light; a pixel transistor portion which outputs a signal charge generated by the photoelectric conversion portion; a peripheral circuit portion which is provided at the periphery of a pixel portion including the photoelectric conversion portion and the pixel transistor portion and which has an NMOS transistor and a PMOS transistor; a first stress liner film which has a compressive stress and which is provided on the PMOS transistor; and a second stress liner film which has a tensile stress and which is provided on the NMOS transistor. In addition, the photoelectric conversion portion, the pixel transistor portion, and the peripheral circuit portion are provided in and/or on a semiconductor substrate.

In the image capturing apparatus according to an embodiment of the present invention, the first stress liner film having a compressive stress is formed on the PMOS transistor of the peripheral circuit portion of the solid-state image device, and the second stress liner film having a tensile stress is formed on the NMOS transistor. Accordingly, the mobilities of the individual transistors of the peripheral circuit portion of the solid-state image device are improved, so that the operation speed is increased.

In the solid-state image device according to an embodiment of the present invention, since the mobilities of the MOS transistors are improved, the operation speed can be improved. In addition, an increase in pixel number can be realized without decreasing the operation speed. Furthermore, since the generation of noise caused by the stress liner film is suppressed, the degradation in image quality caused by noise can be suppressed, and hence a high quality image can be obtained. As described above, by using the stress liner technique, the increase in operation speed and the reduction in noise can be advantageously realized at the same time.

In the method for manufacturing a solid-state image device according to an embodiment of the present invention, since the mobilities of the MOS transistors are improved, the operation speed can be improved. In addition, the increase in pixel number can be realized without decreasing the operation speed. Furthermore, since the generation of noise caused by the stress liner film is suppressed, the degradation in image quality caused by noise can be suppressed, and hence a high quality image can be obtained. As described above, by using the stress liner technique, the increase in operation speed and the reduction in noise can be advantageously realized at the same time.

In the image capturing apparatus according to an embodiment of the present invention, since the solid-state image device which realizes the increase in operation speed and the reduction in noise is installed, a fast image processing speed and a high quality image can be advantageously obtained at the same time.

BRIEF DESCRIPTION OF THE DRAWINGS

FIGS. 7A and 7B are a plan layout view and an equivalent circuit diagram, respectively, showing an application example of the solid-state image device according to the first embodiment;

FIG. 8 is a plan layout view showing an application example a solid-state image device according to an embodiment of the present invention;

FIG. 9 is a plan layout view showing an application example a solid-state image device according to an embodiment of the present invention;

DESCRIPTION OF THE PREFERRED EMBODIMENTS

Hereinafter, embodiments for carrying out the present invention (hereinafter referred to as "embodiments") will be described.

1. First Embodiment

[First Example of the Structure of a Solid-State Image Device]

A first example of the structure of a solid-state image device according to a first embodiment of the present invention will be described with reference to a schematic cross-sectional structural view of FIG. 1.

Figure 1:
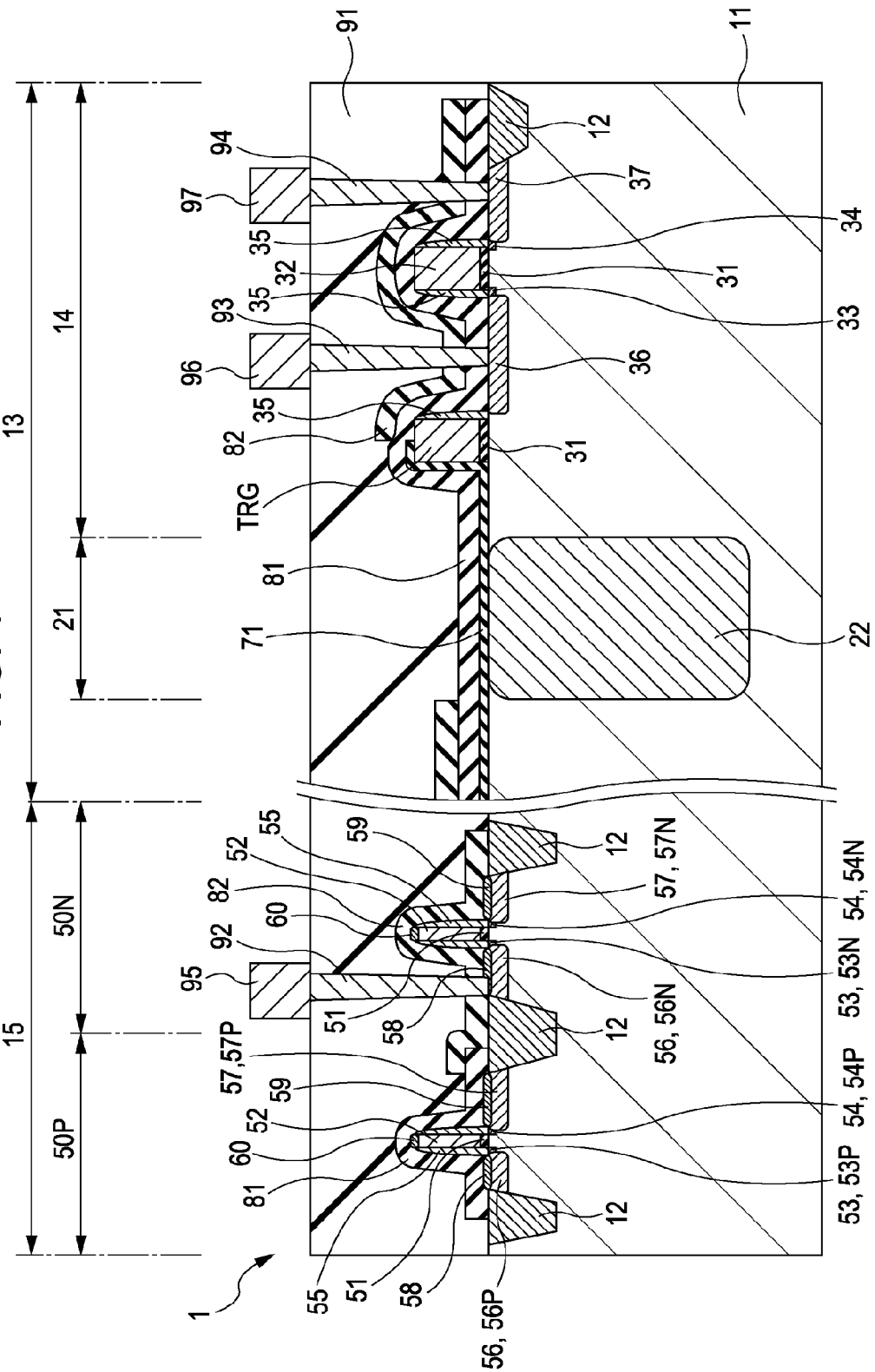
FIG. 1 is a schematic cross-sectional view showing a first example of the structure of a solid-state image device according to a first embodiment of the present invention.

As shown in FIG. 1, an element isolation region 12 which isolates a photoelectric conversion portion 21, a pixel transistor portion 14, a peripheral circuit portion 15, and the like is formed in a semiconductor substrate 11, these portions 21 and 14 forming a pixel portion 13. As the semiconductor substrate 11, for example, a silicon substrate is used. Of course, a silicon-on-insulator (SOI) substrate may also be used. The element isolation region 12 is formed to have a shallow trench isolation (STI) structure. In addition, the periphery of the photoelectric conversion portion 21 and the periphery of the pixel transistor portion 14 each may also have an STI structure. Alternatively, the periphery of the photoelectric conversion portion 21 may be formed of a p-type diffusion layer, and the periphery of the pixel transistor portion 14 may be formed to have an STI structure. Furthermore, the periphery of the photoelectric conversion portion 21 and the periphery of the pixel transistor portion 14 each may be formed of a p-type diffusion layer.

Although not being shown in the figure, a well region is formed in the semiconductor substrate 11. The well region may be separately formed for the pixel portion 13 and the peripheral circuit portion 15. In addition, in the peripheral circuit portion 15, an N well region and a P well region may also be separately formed.

Furthermore, impurities for adjusting the threshold values of transistors are separately introduced in an NMOS transistor region, a PMOS transistor region, and the pixel transistor portion 14.

A gate electrode 32 (including a transfer gate electrode TRG) of the pixel transistor portion 14 is formed on the surface of the semiconductor substrate 11 with a gate insulating film 31 interposed therebetween. In addition, gate electrodes 52 of the peripheral circuit portion 15 are each formed on the semiconductor substrate 11 with a gate insulating film 51 interposed therebetween. The gate insulating films 31 and 51 are each formed, for example, of a silicon oxide film having a thickness of approximately 1 to 10 nm. Of course, as a gate insulating film other than a silicon oxide film, for example, a high dielectric constant film, such as a silicon nitride film or a hafnium oxide film, may also be used in the peripheral circuit portion 15. In this case, the gate insulating films 31 and 51 for the pixel portion 13 and the peripheral circuit portion 15, respectively, may be separately formed.

The gate electrodes 32 and 52 are each formed, for example, of polysilicon having a thickness of 100 to 200 nm. The gate electrodes 32 and 52 are each formed to have a line width, for example, of several tens of nanometers at the minimum.

A photodiode 22 of the photoelectric conversion portion 21 in which a signal charge is obtained by photoelectric conversion of incident light is formed in the semiconductor substrate 11. This photodiode 22 is formed of an N-type region and a P-type region located thereon.

Source/drain extension regions (lightly doped drain: LDD) 33 and 34 are formed in the semiconductor substrate 11 at two sides of the gate electrode 32. In addition, source/drain extension regions (LDD) 53 and 54 are formed in the semiconductor substrate 11 at two sides of each of the gate electrodes 52. The source/drain extension regions 53 (53N) and 54 (54N) of the NMOS transistor are formed by doping an n-type impurity such as arsenic ions ($As^+$) or phosphorous ions ($P^+$). The source/drain extension regions 53 (53P) and 54 (54P) of the PMOS transistor are formed by doping a p-type impurity such as boron ions ($B^+$) or indium ions ($In^+$).

In addition, offset spacers (not shown) may also be formed on sidewalls of the gate electrodes 32 and 52.

Sidewall spacers 35 are formed on the sidewalls of the gate electrode 32, and sidewall spacers 55 are formed on the sidewalls of each gate electrode 52. In addition, a sidewall forming film 71 forming the sidewall spacers 35 and 55 is allowed to remain on the photodiode 22 of the photoelectric conversion portion 21 so as to prevent etching damage from being done to the photodiode 22.

Source/drain regions 36 and 37 are formed in the semiconductor substrate 11 at the two sides of the gate electrode 32 of the pixel transistor portion 14 with the source/drain extension regions 33 and 34, respectively, interposed therebetween. The source/drain region 36 also functions as a floating diffusion FD.

As described above, the pixel transistor portion 14 is shown by only one pixel transistor in the figure; however, the pixel transistor portion 14 is formed, for example, of four transistors, that is, a transfer transistor, a reset transistor, an amplifying transistor, and a selection transistor. Alternatively, the pixel transistor portion 14 is formed of three transistors, that is, a reset transistor, an amplifying transistor, and a selection transistor. In addition, the individual transistors are formed, for example, so that the source/drain regions are connected in series.

In addition, source/drain regions 56 (56N) and 57 (57N) are formed in the semiconductor substrate 11 at the two sides of the gate electrode 52N of the peripheral circuit portion 15 with the source/drain extension regions 53 (53N) and 54 (54N), respectively, interposed therebetween. Source/drain regions 56 (56P) and 57 (57P) are formed in the semiconductor substrate 11 at the two sides of the gate electrode 52P of the peripheral circuit portion 15 with the source/drain extension regions 53 (53P) and 54 (54P), respectively, interposed therebetween.

Furthermore, silicide layers 58, 59, and 60 are formed on the source/drain regions 56 and 57 and the gate electrodes 52, respectively. The silicide layers 58, 59, and 60 are each formed of silicide, for example, of cobalt (Co), nickel (Ni), platinum (Pt), or a compound thereof.

In addition, a silicide block film (not shown) which prevents the formation of the silicide layer on the pixel transistor portion 14 is formed thereon. This silicide block film is formed of an insulating film, such as a silicon oxide film or a silicon nitride film.

As described above, in the pixel portion 13, there are formed the photodiode 22 of the photoelectric conversion portion 21 and the pixel transistor portion 14 which outputs a signal charge generated by the photodiode 22. In addition, at the periphery of the pixel portion 13, the peripheral circuit portion 15 having an NMOS transistor 50N and a PMOS transistor 50P is formed.

A first stress liner film 81 having a compressive stress is formed on the PMOS transistor 50P, the photoelectric conversion portion 21, and the pixel transistor portion 14. The first stress liner film 81 is formed of a silicon nitride film having a compressive stress. This silicon nitride film has a film thickness, for example, of 10 to 100 nm and contains many nitrogen-hydrogen (N-H) bonds. For example, the number of nitride-hydrogen bonds of this silicon nitride film is two to four times that of a silicon nitride film having no compressive stress.

When the first stress liner film 81 is formed, for example, to have a thickness of approximately 20 to 100 nm, the internal stress thereof is approximately −1.5 to −2.5 GPa.

By this first stress liner film 81, since the compressive stress is applied to the channel region of the PMOS transistor 50P of the peripheral circuit portion 15, the mobility of a hole is increased, and hence a high speed PMOS transistor 50P can be realized.

A second stress liner film 82 having a tensile stress is formed on the NMOS transistor 50N and on the pixel transistor portion 14. The second stress liner film 82 is formed of a silicon nitride film having a tensile stress. This silicon nitride film has a film thickness, for example, of 10 to 100 nm.

When the second stress liner film 82 is formed, for example, to have a thickness of approximately 20 to 100 nm, the internal stress thereof is approximately 1.0 to 2.0 GPa.

By this second stress liner film 82, since the tensile stress is applied to the channel region of the NMOS transistor 50N of the peripheral circuit portion 15, the mobility of an electron is increased, and hence a high speed NMOS transistor 50N can be realized.

In addition, the stress of the first stress liner film 81 and that of the second stress liner film 82 formed thereon are counterbalanced with each other on each transistor of the pixel transistor portion 14. Accordingly, the state in which no stress is applied to each transistor or the state in which even if a stress is applied to each transistor, no adverse influence is generated can be obtained. The individual transistors are, for example, a transfer transistor, a reset transistor, an amplifying transistor, and a selection transistor. When a large stress is applied to this pixel transistor portion 14, noise is liable to be generated, particularly, in the amplifying transistor.

In addition, when a thick silicon nitride (SiN) film is formed on the photodiode 22 of the photoelectric conversion portion 21, light absorption occurs, and the sensitivity is degraded; however, since the second stress liner film 82 is not formed, degradation in sensitivity can be suppressed.

An interlayer insulating film 91 is formed on the pixel portion 13 which includes the pixel transistor portion 14, the photoelectric conversion portion 21, and the like and on the peripheral circuit portion 15. As one example, electrodes 92, 93, and 94 connected to the source/drain region 56N of the NMOS transistor 50N and the source/drain regions 36 and 37 of the pixel transistor portion 14, respectively, are formed in the interlayer insulating film 91. In addition, wires 95, 96, and 97 connected to the electrodes 92, 93, and 94, respectively, are formed.

Furthermore, although not being shown in the figure, a planarizing insulating film which covers the above wires 95, 96, and 97 is formed, and a color filter layer and a microlense guiding incident light to the photodiode 22 of the photoelectric conversion portion 21 are formed. As described above, a solid-state image device 1 of a CMOS image sensor is formed.

In the first example of the solid-state image device 1, since the first stress liner film 81 having a compressive stress is formed on the PMOS transistor 50P, the compressive stress of the first stress liner film 81 can be applied to the channel region of the PMOS transistor 50P. Hence, the mobility of the PMOS transistor 50P can be improved. In addition, since the second stress liner film 82 having a tensile stress is formed on the NMOS transistor 50N, the tensile stress of the second stress liner film 82 can be applied to the channel region of the NMOS transistor 50N. Hence, the mobility of the NMOS transistor 50N can be improved.

Accordingly, the operation speed of the peripheral circuit portion 15 can be improved, and the increase in pixel number can be realized without decreasing the operation speed.

In addition, since the compressive stress of the first stress liner film 81 and the tensile stress of the second stress liner film 82 are counterbalanced with each other on the pixel transistor portion 14, the generation of noise caused by the stress of the stress liner film can be suppressed. In particular, the effect on the amplifying transistor of the pixel transistor portion 14 is significant. Hence, the degradation in image quality caused by noise can be suppressed, and hence a high quality image can be obtained.

As described above, by using the stress liner technique, the increase in operation speed and the reduction in noise of the image sensor portion can be advantageously realized at the same time.

In addition, since the first stress liner film 81 made of a silicon nitride film containing hydrogen is formed on the pixel portion 13, hydrogen is supplied to the semiconductor substrate 11 of the pixel portion 13, so that an effect of compensating for defects of the substrate can be expected. That is, the hydrogen functions to terminate dangling bonds of the transistor and the photodiode 22 of the pixel portion 13. Accordingly, a low-noise transistor can be realized, and generation of white spots caused by generation of electrons can be suppressed.

[Second Example of the Structure of the Solid-State Image Device]

Next, a second example of the structure of the solid-state image device according to the first embodiment of the present invention will be described with reference to a schematic structural cross-sectional view of FIG. 2.

Figure 2:
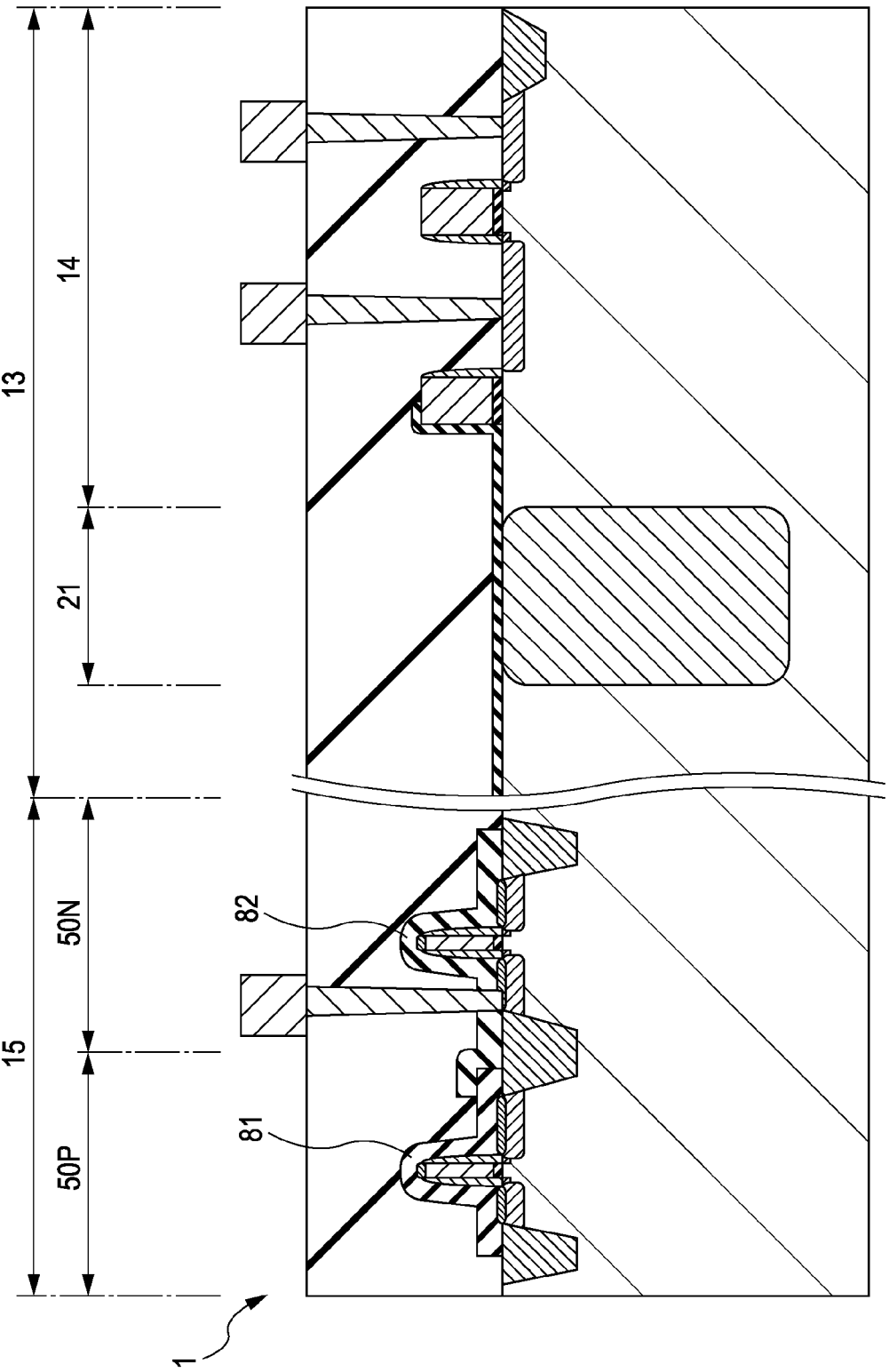
FIG. 2 is a schematic cross-sectional view showing a second example of the structure of the solid-state image device according to the first embodiment.

In the second example of the solid-state image device 1, as shown in FIG. 2, the first stress liner film 81 of the first example of the solid-state image device 1 is formed as described below. That is, the first stress liner film 81 is formed so as to cover only the PMOS transistor 50P of the peripheral circuit portion 15.

Furthermore, the second stress liner film 82 is formed so as to cover only the NMOS transistor 50N.

The remaining structure is similar to that of the first example of the solid-state image device 1.

In the second example of the solid-state image device 1, as in the first example, since the mobility of the PMOS transistor 50P and that of the NMOS transistor 50N can be improved, the operation speed of the peripheral circuit portion 15 can be improved. In addition, the increase in pixel number can be realized without decreasing the operation speed.

In addition, since the stress liner film is not provided on the pixel portion 13, noise caused by the stress liner film is not generated. Hence, the degradation in image quality caused by noise can be suppressed, and a high quality image can be obtained.

As described above, by using the stress liner technique, the increase in operation speed and the reduction in noise of the image sensor portion can be advantageously realized at the same time.

[Third Example of the Structure of the Solid-State Image Device]

Next, a third example of the structure of the solid-state image device according to the first embodiment of the present invention will be described with reference to a schematic structural cross-sectional view of FIG. 3.

Figure 3:
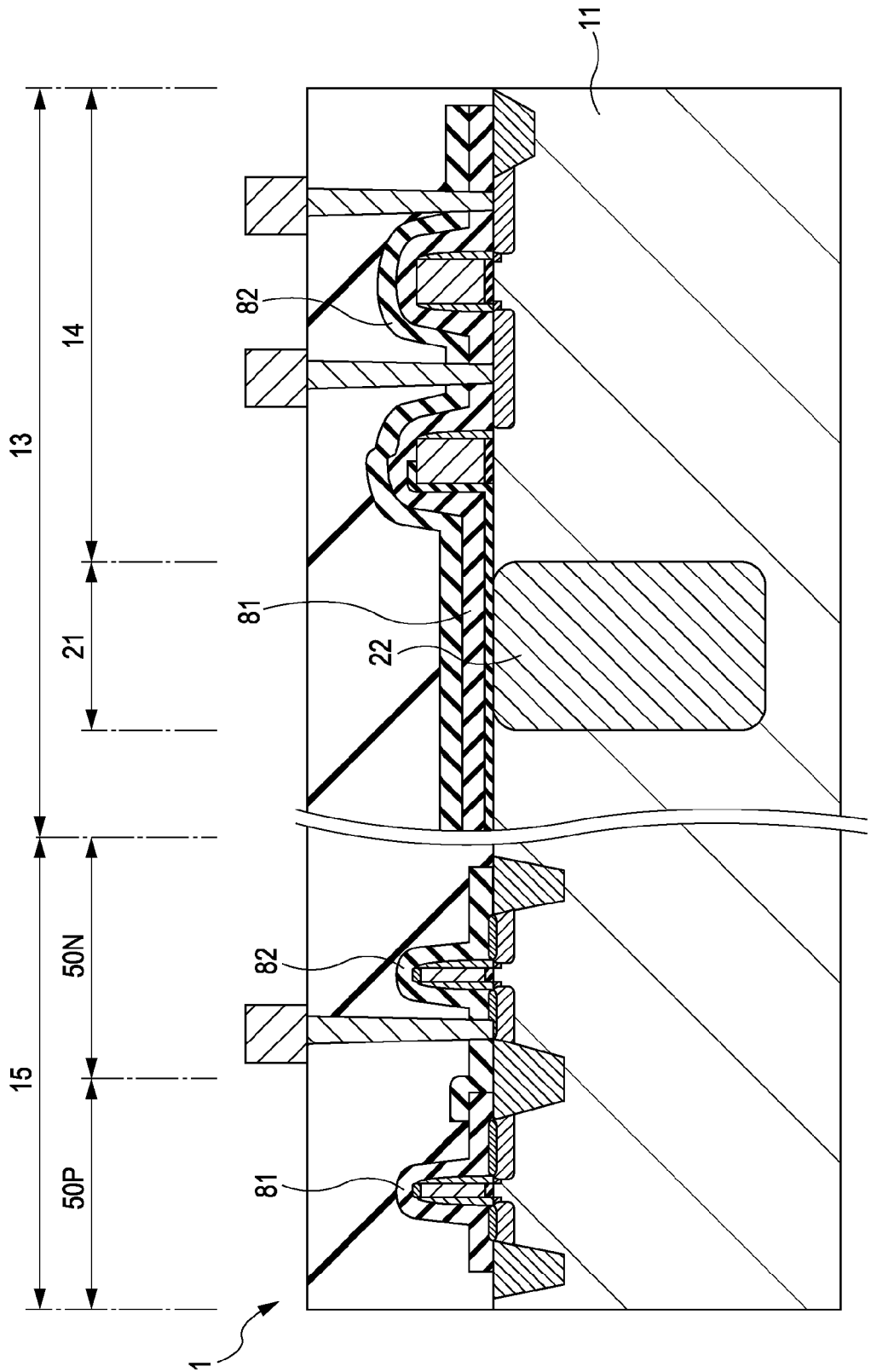
FIG. 3 is a schematic cross-sectional view showing a third example of the structure of the solid-state image device according to the first embodiment.

In the third example of the solid-state image device 1, as shown in FIG. 3, the first stress liner film 81 of the first example of the solid-state image device 1 is formed as described below. That is, the first stress liner film 81 is formed so as to cover the photodiode 22 of the photoelectric conversion portion 21 and the pixel transistor portion 14 as well as the PMOS transistor 50P.

Furthermore, the second stress liner film 82 is formed as described below. That is, the second stress liner film 82 is formed so as to cover the photodiode 22 of the photoelectric conversion portion 21 and the pixel transistor portion 14 as well as the NMOS transistor 50N.

The remaining structure is similar to that of the first example of the solid-state image device 1.

In the third example of the solid-state image device 1, as in the first example, since the mobility of the PMOS transistor 50P and that of the NMOS transistor 50N can be improved, the operation speed of the peripheral circuit portion 15 can be improved. In addition, the increase in pixel number can be realized without decreasing the operation speed.

In addition, since the compressive stress of the first stress liner film 81 and the tensile stress of the second stress liner film 82 formed thereon are counterbalanced with each other on the pixel portion 13, the generation of noise caused by the stress liner films can be suppressed. Hence, the degradation in image quality caused by noise can be suppressed, and a high quality image can be obtained.

As described above, by using the stress liner technique, the increase in operation speed and the reduction in noise of the image sensor portion can be advantageously realized at the same time.

In addition, as in the first example, since the first stress liner film 81 made of a silicon nitride film containing hydrogen is formed on the pixel portion 13, hydrogen is supplied to the semiconductor substrate 11 of the pixel portion 13, so that the effect of compensating for defects of the substrate can be expected.

In addition, in order to decrease the attenuation of light incident on the photodiode 22, within the range in which the above effect is not degraded, the thickness of the first stress liner film 81 and that of the second stress liner film 82 laminated thereto are preferably decreased as small as possible.

[Fourth Example of the Structure of the Solid-State Image Device]

Next, a fourth example of the structure of the solid-state image device according to the first embodiment of the present invention will be described with reference to a schematic structural cross-sectional view of FIG. 4.

Figure 4:
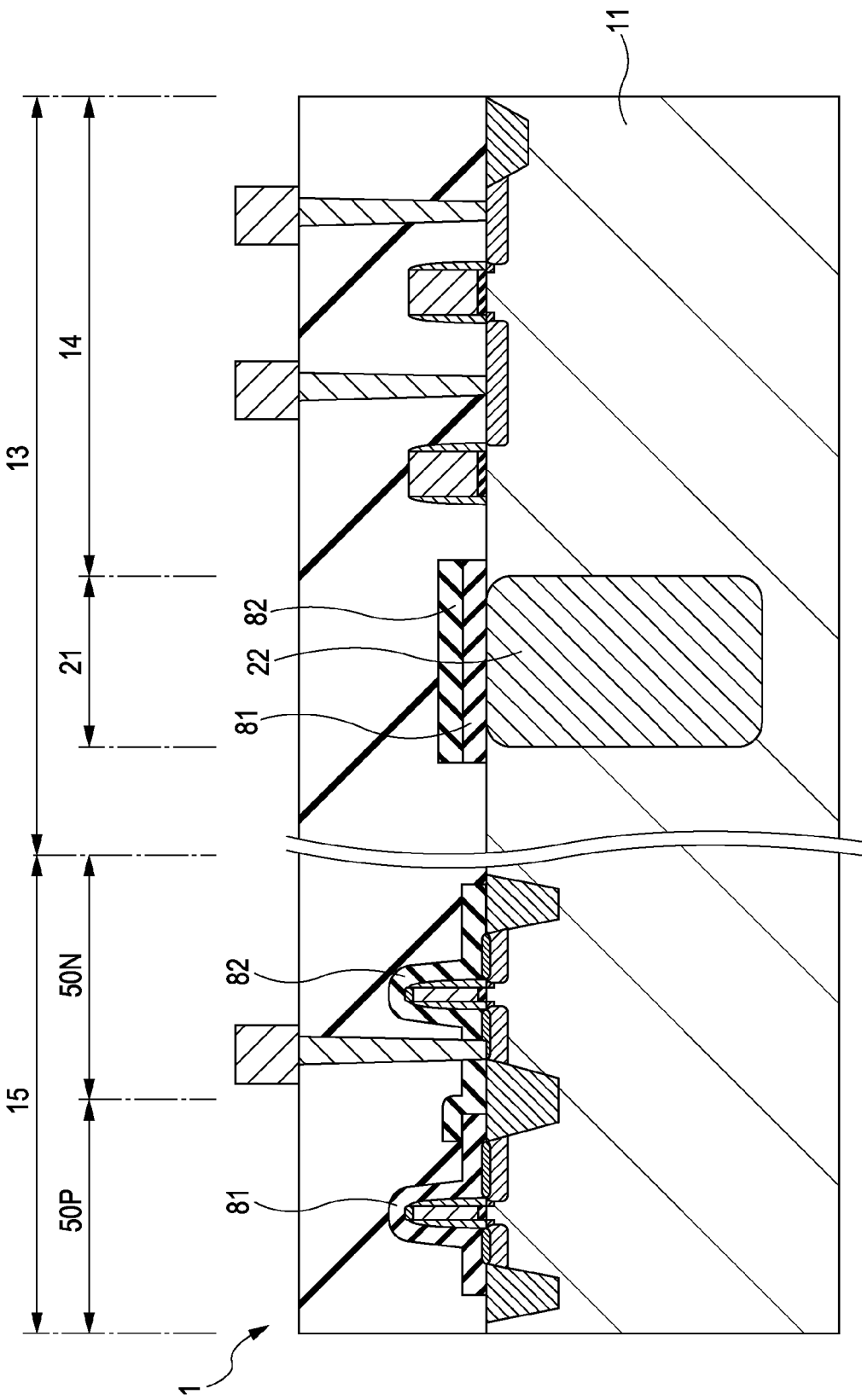
FIG. 4 is a schematic cross-sectional view showing a fourth example of the structure of the solid-state image device according to the first embodiment.

In the fourth example of the solid-state image device 1, as shown in FIG. 4, the first stress liner film 81 is formed as described below. That is, the first stress liner film 81 is formed so as to cover the photodiode 22 of the photoelectric conversion portion 21 as well as the PMOS transistor 50P. The first stress liner film 81 is not formed on the pixel transistor portion 14.

Furthermore, the second stress liner film 82 is formed as described below. That is, the second stress liner film 82 is formed so as to cover the photoelectric conversion portion 21 as well as the NMOS transistor 50N. The second stress liner film 82 is not formed on the pixel transistor portion 14.

The remaining structure is similar to that of the first example of the solid-state image device 1.

In the fourth example of the solid-state image device 1, as in the first example, since the mobility of the PMOS transistor 50P and that of the NMOS transistor 50N can be improved, the operation speed of the peripheral circuit portion 15 can be improved. In addition, the increase in pixel number can be realized without decreasing the operation speed.

In addition, since the generation of noise caused by the stress liner film can be suppressed, the degradation in image quality caused by noise can be suppressed, and hence a high quality image can be obtained.

As described above, by using the stress liner technique, the increase in operation speed and the reduction in noise of the image sensor portion can be advantageously realized at the same time.

In addition, as in the first example, since the first stress liner film 81 made of a silicon nitride film containing hydrogen is formed on the photodiode 22, hydrogen is supplied to the semiconductor substrate 11 of the photodiode 22, so that the effect of compensating for defects of the substrate can be expected.

In addition, in order to counterbalance the compressive stress of the first stress liner film 81 with the tensile stress of the second stress liner film 82 on the photodiode 22, the thicknesses and the internal stresses of the stress liner films may be adjusted.

In addition, in order to decrease the attenuation of light incident on the photodiode 22, within the range in which the above effect is not degraded, the thickness of the first stress liner film 81 and that of the second stress liner film 82 laminated thereto are preferably decreased as small as possible.

[Fifth Example of the Structure of the Solid-State Image Device]

Next, a fifth example of the structure of the solid-state image device according to the first embodiment of the present invention will be described with reference to a schematic structural cross-sectional view of FIG. 5.

Figure 5:
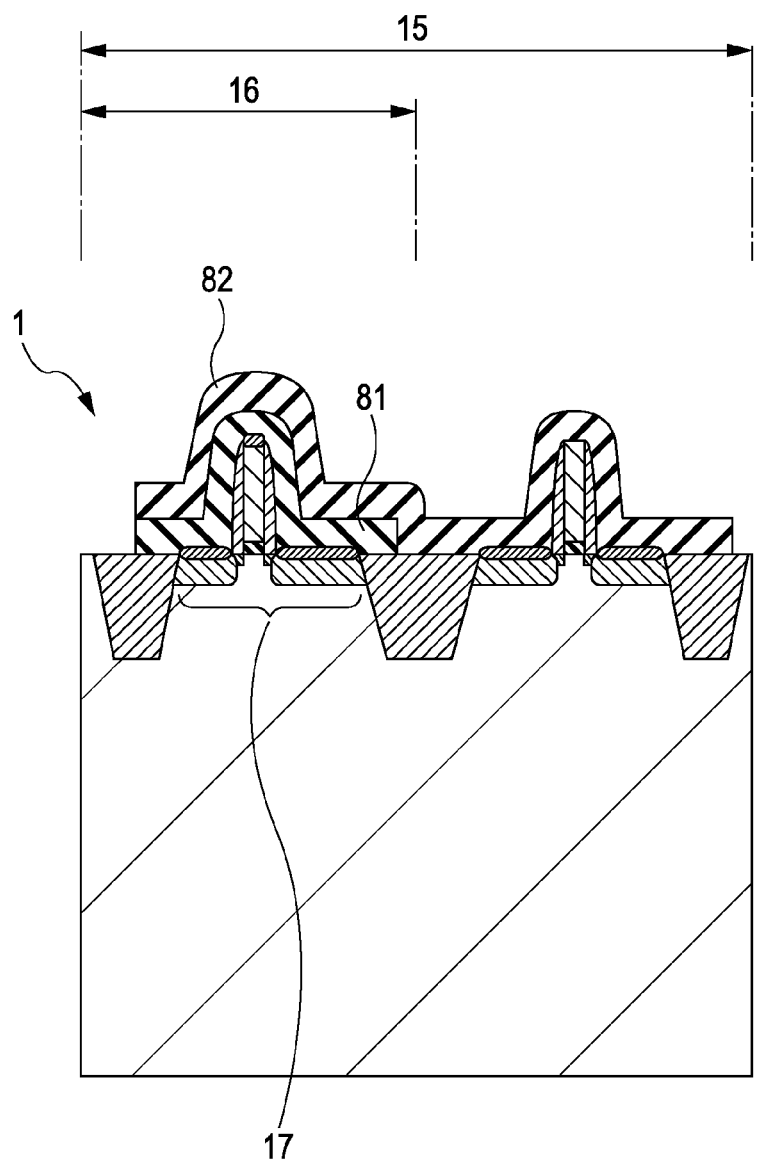
FIG. 5 is a schematic cross-sectional view showing a fifth example of the structure of the solid-state image device according to the first embodiment.

As shown in FIG. 5, in the first to the fourth examples of the solid-state image device 1, an analog element portion 16 is formed on and in the semiconductor substrate 11 of the peripheral circuit portion 15. This analog element portion 16 includes a pair transistor 17 and a polysilicon resistance (not shown), each of which is liable to generate noise when it receives a stress. For example, the first stress liner film 81 and the second stress liner film 82 are laminated to each other so as to cover the pair transistor 17 and the polysilicon resistance (not shown). Since the first stress liner film 81 having a compressive stress and the second stress liner film 82 having a tensile stress are laminated to each other as described above, the stresses thereof are counterbalanced with each other; hence, the structure is formed so that no stress is applied to the analog element portion 16 or a stress causing an adverse influence is not applied thereto.

[Sixth Example of the Structure of the Solid-State Image Device]

Next, a sixth example of the structure of the solid-state image device according to the first embodiment of the present invention will be described with reference to a schematic structural cross-sectional view of FIG. 6.

Figure 6:
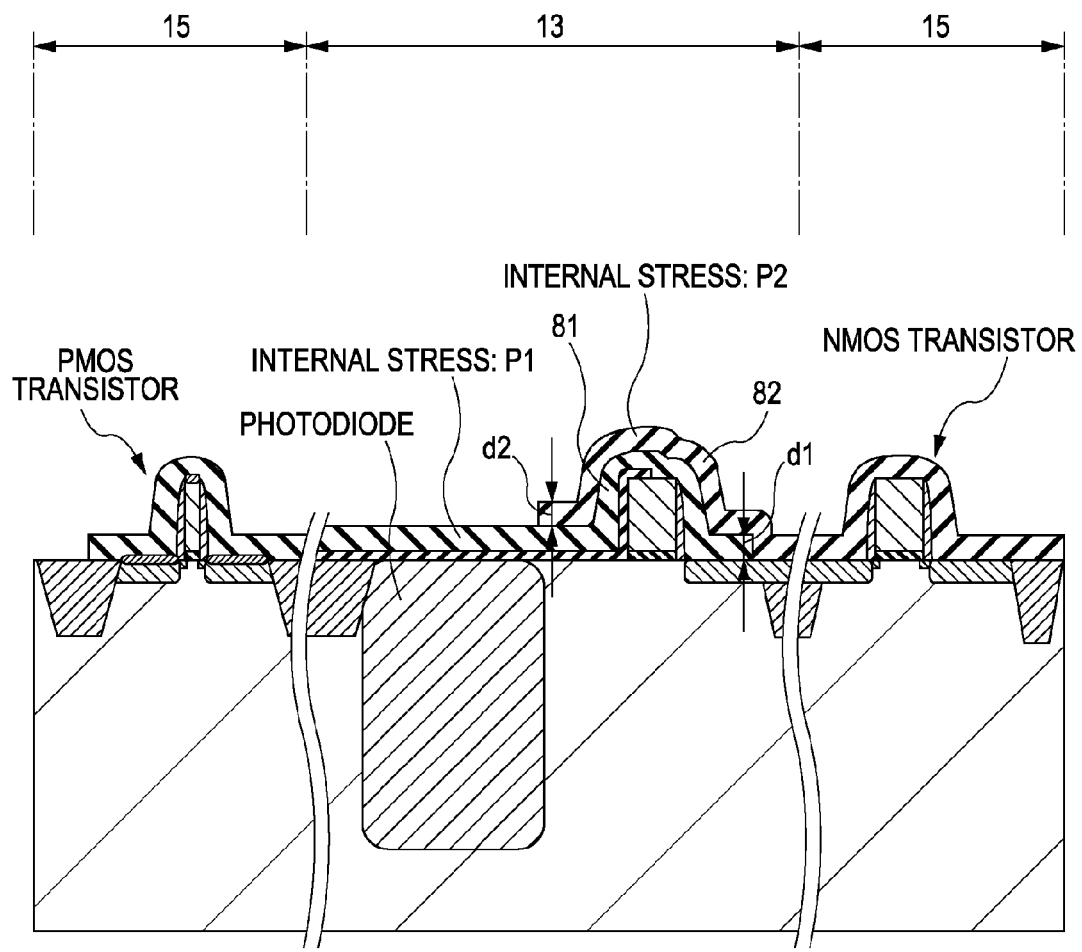
FIG. 6 is a schematic cross-sectional view showing a sixth example of the structure of the solid-state image device according to the first embodiment.

As shown in FIG. 6, in the region in which the first stress liner film 81 and the second stress liner film 82 are overlapped with each other, the thickness and the internal stress of the first stress liner film 81 are represented by d1 and P1, respectively, and the thickness and the internal stress of the second stress liner film 82 are represented by d2 and P2, respectively. The compressive stress P1 is represented by a negative value, and the tensile stress P2 is represented by a positive value. In addition, the thicknesses and the stresses of the first stress liner film 81 and the second stress liner film 82 are set so as to satisfy the following formulas per unit width w. In the following formulas, the w is set to 1.

$$(d1 \times P1) + (d2 \times P2) = \Delta p,$$

$$|\Delta p| < 300 \text{ MPa}$$

In the above formulas, the above $\Delta p$ indicates the difference between the stress applied to the channel region by the first stress liner film 81 and the stress applied to the channel region by the second stress liner film 82.

When this $|\Delta p|$ is set to less than 300 MPa, even if the first stress liner film 81 and the second stress liner film 82 are formed on the pixel portion 13 and the analog element portion (not shown), the generation of noise can be suppressed. On the other hand, when the $|\Delta p|$ is 300 MPa or more, the pixel portion 13 and the analog element portion (not shown) are influenced by noise.

Accordingly, the $|\Delta p|$ is set to less than 300 MPa.

[Application Example 1 of the Solid-State Image Device]

Next, an application example of the solid-state image device 1 will be described.

First, a structural example in which one pixel is output by one pixel transistor portion will be described with reference to a plan layout view of FIG. 7A and an equivalent circuit diagram of FIG. 7B.

As shown in FIGS. 7A and 7B, the structure is formed of one photoelectric conversion portion 21 (photodiode 22) and the pixel transistor portion 14 which includes the transfer gate electrode TRG, the floating diffusion FD, a reset transistor RST, an amplifying transistor Amp, and a selection transistor SEL. This is a type in which the photodiode is not shared; however, of course, there are a type in which the photodiode is shared and a type in which a three-transistor structure is used instead of a four-transistor structure.

[Application Example 2 of the Solid-State Image Device]

Next, a so-called two-pixel shared structural example in which two pixels are output by one pixel transistor portion will be described with reference to a plan layout view of FIG. 8.

As shown in FIG. 8, this example is a so-called two-pixel shared structure, and two photoelectric conversion portions 21 (21A and 21B) are disposed. At the center of the arrangement of the photoelectric conversion portions 21, a floating diffusion portion FD is formed in an active region which is connected to the two photoelectric conversion portions 21. In addition, at the boundaries between the floating diffusion FD and the two photoelectric conversion portions 21, transfer gates TRG (TRG-A and TRG-B) are respectively formed. In regions adjacent to the photoelectric conversion portions 21, the pixel transistor portions 14 (14A and 14B) are each formed with the element isolation region 12 interposed therebetween. In this pixel transistor portion 14A, for example, a reset transistor RST is disposed. In addition, in this pixel transistor portion 14B, for example, an amplifying transistor Amp and a selection transistor SEL are disposed in series. Of course, the reset transistor RST, the amplifying transistor Amp, and the selection transistor SEL may be disposed collectively at one side.

[Application Example 3 of the Solid-State Image Device]

Next, a so-called four-pixel shared structural example in which four pixels are output by one pixel transistor portion will be described with reference to a plan layout view of FIG. 9.

As shown in FIG. 9, photoelectric conversion portions 21 (21A, 21B, 21C, and 21D) of four pixels are disposed in 2 rows and 2 columns. At the center of the arrangement of the four photoelectric conversion portions 21, a floating diffusion portion FD is formed in an active region which is connected to the individual photoelectric conversion portions 21. In addition, at the boundaries between the floating diffusion portion FD and the individual photoelectric conversion portions 21, transfer gate electrodes TRG (TRG-A, TRG-B, TRG-C, and TRG-D) are each provided with a gate insulating film (not shown) interposed therebetween. The peripheries of the individual photoelectric conversion portions 21 are electrically isolated by an element isolation region 12D made of a diffusion layer except for regions under the above transfer gates TRG. In addition, in a region adjacent to the individual photoelectric conversion portions 21, the pixel transistor portion 14 is formed with the element isolation region 12 interposed therebetween. This pixel transistor portion 14 is formed, for example, of a reset transistor RST, an amplifying transistor Amp, and a selection transistor SEL are provided in series.

The first stress liner film 81 and the second stress liner film 82 according to an embodiment of the present invention can be applied to any of the above application examples 1 to 3.

2. Second Embodiment

[First Example of a Method for Manufacturing a Solid-State Image Device]

A first example of a method for manufacturing a solid-state image device according to a second embodiment of the present invention will be described with reference to FIGS. 10 to 14 which are cross-sectional views illustrating a manufacturing process.

[Formation of the Element Isolation Region, the Well, and the Like]

Figure 10:
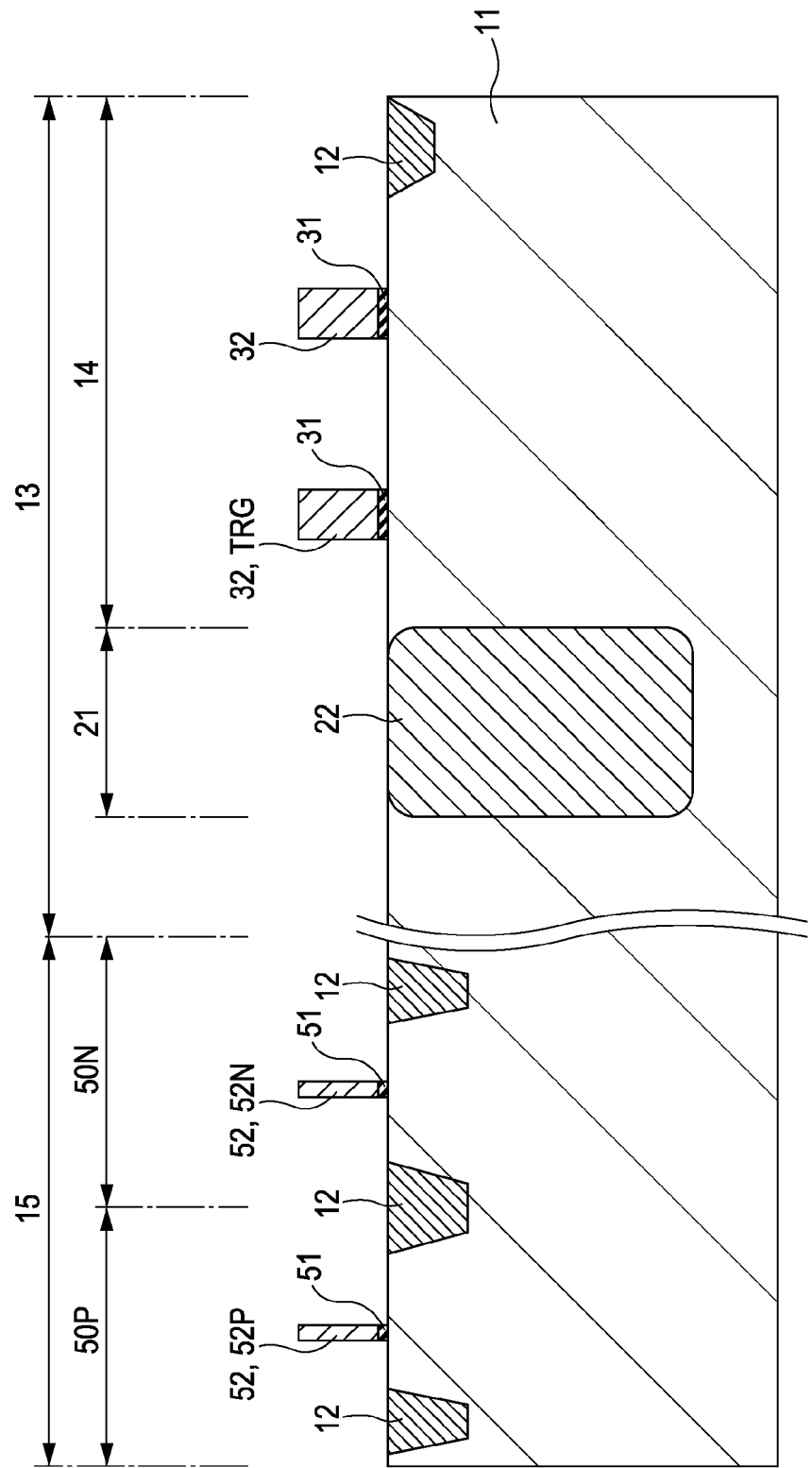
FIG. 10 is a cross-sectional view showing a first example of a method for manufacturing a solid-state image device according to a second embodiment of the present invention.

As shown in FIG. 10, the element isolation region 12 which isolates the photoelectric conversion portion 21, the pixel transistor portion 14, the peripheral circuit portion 15, and the like is formed in the semiconductor substrate 11, the portions 21 and 14 forming the pixel portion 13.

As the semiconductor substrate 11, for example, a silicon substrate is used. Of course, a silicon-on-insulator (SOI) substrate may also be used.

The element isolation region 12 is formed to have a shallow trench isolation (STI) structure. In addition, the periphery of the photoelectric conversion portion 21 and the periphery of the pixel transistor portion 14 each may also have an STI structure. Alternatively, the periphery of the photoelectric conversion portion 21 may be formed of a p-type diffusion layer, and the periphery of the pixel transistor portion 14 may be formed to have an STI structure. Furthermore, the periphery of the photoelectric conversion portion 21 and the periphery of the pixel transistor portion 14 each may be formed of a p-type diffusion layer.

Next, an impurity is ion-implanted into the semiconductor substrate 11 to form a desired well region (not shown). In addition, the photoelectric conversion portion 21 is formed, for example, of the photodiode 22. As a film to prevent channeling caused by the ion implantation, a sacrifice oxide film (not shown) is preferably formed on the surface of the semiconductor substrate 11. This sacrifice oxide film is formed, for example, of a silicon oxide film obtained by oxidizing the surface of the semiconductor substrate 11.

The well region described above may be separately formed for the pixel portion 13 and the peripheral circuit portion 15. In addition, in the peripheral circuit portion 15, the N well region and the P well region may be separately formed.

Furthermore, impurity implantation for adjusting the threshold values of transistors may be separately performed, for example, by ion implantation in an NMOS transistor forming region, a PMOS transistor forming region, and the pixel transistor portion 14.

The sacrifice oxide film is removed after the ion implantation described above, so that the surface of the semiconductor substrate 11 is exposed. For this removal of the sacrifice oxide film, wet etching using hydrofluoric acid is performed, so that etching damage done to the semiconductor substrate 11 can be avoided.

[Formation of the Gates]

Next, the gate insulating films 31 and 51 are formed on the surface of the semiconductor substrate 11. The gate insulating films 31 and 51 are each formed, for example, of a silicon oxide film having a thickness of approximately 1 to 10 nm. Of course, as a gate insulating film other than a silicon oxide film, for example, a high dielectric constant film, such as a silicon nitride film or a hafnium oxide film, may also be formed in the peripheral circuit portion 15. The gate insulating films 31 and 51 may be separately formed on the pixel portion 13 and the peripheral circuit portion 15, respectively.

A gate electrode forming film (not shown) is formed on the gate insulating films 31 and 51. This gate electrode forming film is formed, for example, of polysilicon having a thickness of 100 to 200 nm by a CVD method or the like. After a resist film (not shown) is formed on this gate electrode forming film, for example, by a lithographic technique using KrF exposure or ArF exposure, the resist film is patterned, so that a resist pattern of the gate electrode of the transistor is formed. The gate electrode forming film is dry-etched using this resist pattern as an etching mask, so that the gate electrode 32 (including the transfer gate electrode TRG) of the pixel transistor portion is formed. At the same time, the gate electrode 52 (52P) of the PMOS transistor and the gate electrode 52 (52N) of the NMOS transistor of the peripheral circuit portion 15 are formed. The line widths of the gate electrodes 32 and 52 are formed to have, for example, several tens of nanometers at the minimum.

Next, the resist mask is removed.

Subsequently, by ion implantation or the like, in the semiconductor substrate 11, the photodiode 22 of the photoelectric conversion portion 21 is formed in which a signal charge is obtained by photoelectric conversion of incident light. This photodiode 22 is formed of an N type region and a P type region located thereon.

[Formation of the Source/Drain Extension Regions]

Figure 11:
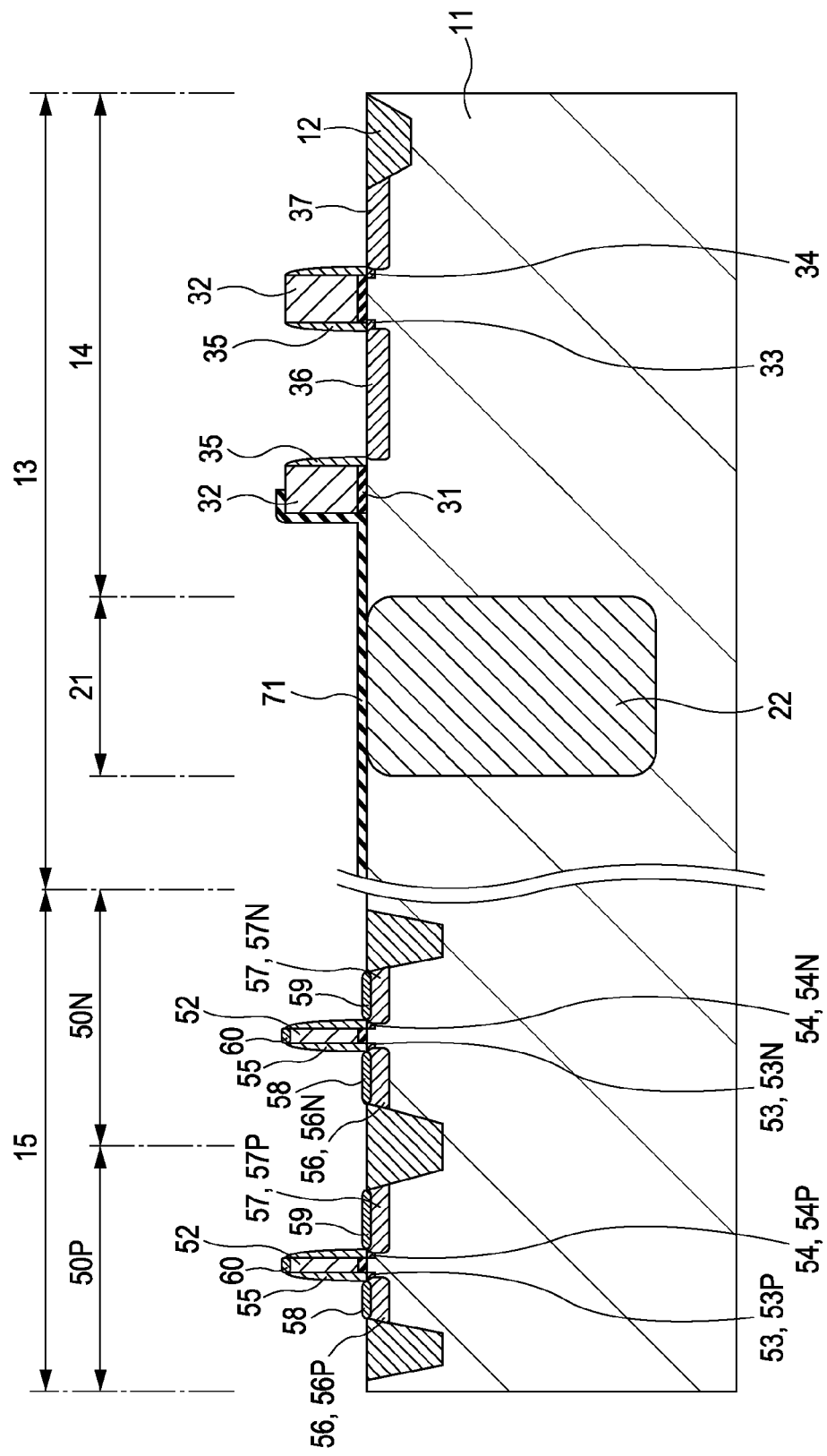
FIG. 11 is a cross-sectional view showing the first example of the method for manufacturing a solid-state image device according to the second embodiment.

Next, as shown in FIG. 11, the source/drain extension regions (LDD) 33 and 34 of each transistor of the pixel transistor portion 14 are formed by ion implantation. In addition, the source/drain extension regions (LDD) 53 and 54 of each transistor of the peripheral circuit portion 15 are formed by ion implantation.

At this stage, the source/drain extension regions 53 (53N) and 54 (54N) of the NMOS transistor are formed by ion implantation of an n-type impurity such as arsenic ions ($As^+$) or phosphorous ions ($P^+$). The source/drain extension regions 53 (53P) and 54 (54P) of the PMOS transistor are formed by ion implantation of a p-type impurity such as boron ions ($B^+$) or indium ions ($In^+$). In each ion implantation, each impurity is implanted at a dose, for example, of $1 \times 10^{14}$ to $2 \times 10^{15}/cm^2$ and at a low acceleration energy, for example, of 100 to 300 eV, so that a shallow junction is formed.

In addition, before the source/drain extension regions 33, 34, 53, and 54 are formed, offset spacers (not shown) may be formed on the sidewalls of the gate electrodes 32 and 52.

[Formation of the Source/Drain Regions]

Next, the sidewall spacers 35 and 55 are formed on the sidewalls of the gate electrodes 32 and 52. At this stage, the photodiode 22 of the photoelectric conversion portion 21 is protected by a resist pattern (not shown) so that damage caused by dry etching is not done to the photodiode 22, and the sidewall forming film 71 is allowed to remain thereon.

Subsequently, after a resist pattern (not shown) having an opening corresponding to the pixel transistor portion 14 is formed, ion implantation is performed using this resist pattern as a mask, so that the source/drain regions 36 and 37 are formed in the semiconductor substrate 11 at the two sides of the gate electrode 32 of the pixel transistor portion 14. In addition, a resist pattern (not shown) having an opening corresponding to the NMOS transistor forming region of the peripheral circuit portion 15 is formed. Ion implantation is then performed using the resist pattern described above as a mask, so that the source/drain regions 56 (56N) and 57 (57N) are formed in the semiconductor substrate 11 at the two sides of the gate electrode 52N of the peripheral circuit portion 15. Furthermore, a resist pattern (not shown) having an opening corresponding to the PMOS transistor forming region of the peripheral circuit portion 15 is formed. Ion implantation is then performed using the resist pattern described above as a mask, so that the source/drain regions 56 (56P) and 57 (57P) are formed in the semiconductor substrate 11 at the two sides of the gate electrode 52P of the peripheral circuit portion 15. Any of the ion implantations described above may be performed first. In addition, after each ion implantation is performed, the resist pattern used as the mask therefor is removed.

Subsequently, activation annealing is performed for the source/drain regions 36, 37, 56, and 57. This activation annealing is performed, for example, at 1,000 to 1,100° C.

[Formation of the Silicide Layers]

Next, by a salicide process, the silicide layers 58, 59, and 60 are formed on the source/drain regions 56 and 57 and the gate electrode 52, respectively, of the peripheral circuit portion 15.

The salicide process described above is performed only on the peripheral circuit portion 15 and is not performed on the pixel portion 13. The reason for this is that white spots and/or noise is generated in the pixel portion 13 by the silicide process. The silicide layers 58, 59, and 60 are each formed of a silicide containing cobalt (Co), nickel (Ni), platinum (Pt), or a compound thereof.

In addition, before the salicide process is performed, a silicide block film (not shown) which prevents the formation of the silicide layer on the pixel transistor portion 14 is preferably formed thereon. This silicide block film is formed of an insulating film, such as silicon oxide film or a silicon nitride film.

As described above, the photodiode 22 of the photoelectric conversion portion 21 and the pixel transistor portion 14 which outputs a signal charge generated by the photodiode 22 are formed in the pixel portion 13. In addition, the peripheral circuit portion 15 including the NMOS transistor 50N and the PMOS transistor 50P is formed at the periphery of the pixel portion 13.

[Formation of the First Stress Liner Film]

Figure 12:
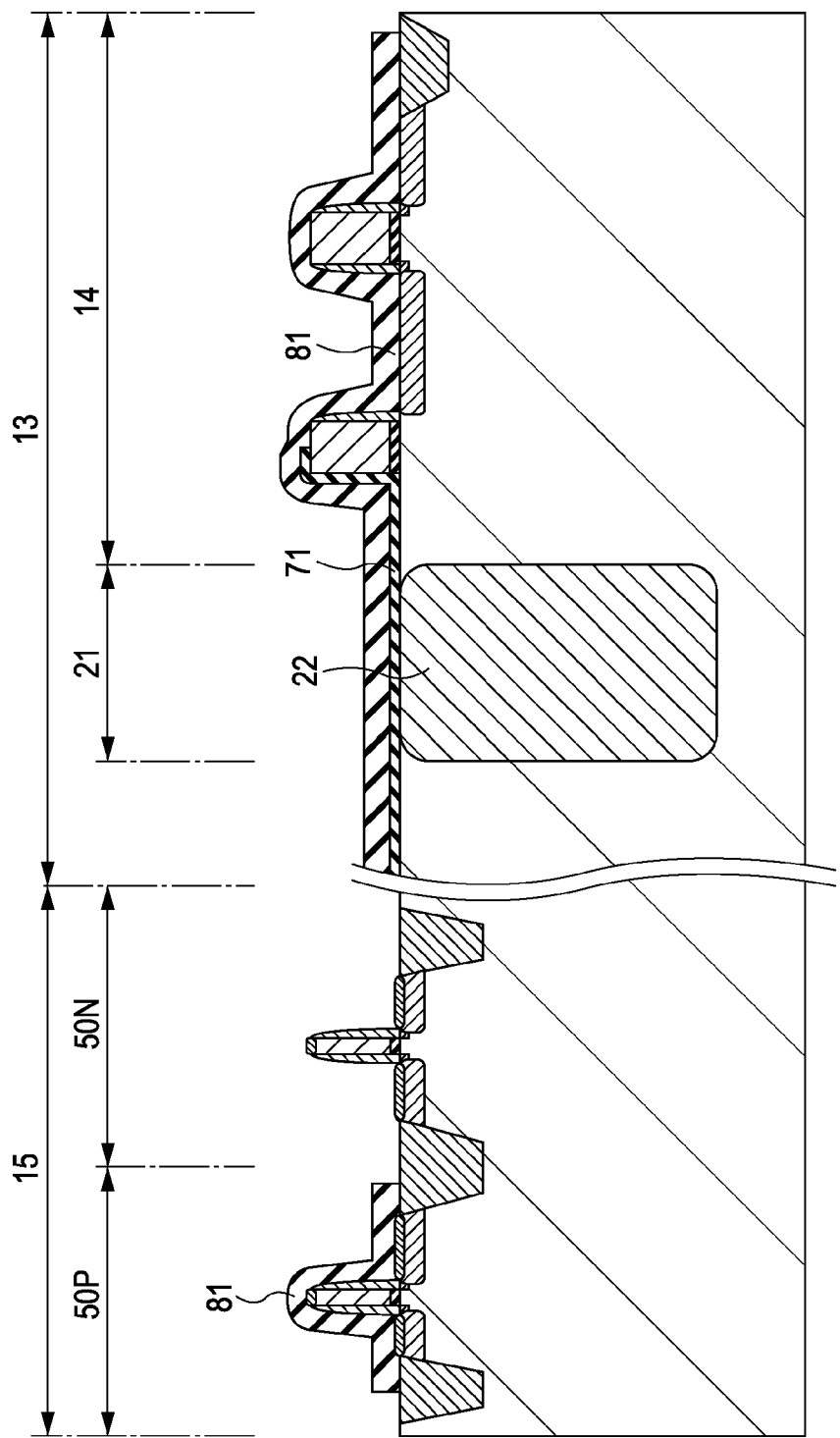
FIG. 12 is a cross-sectional view showing the first example of the method for manufacturing a solid-state image device according to the second embodiment.

Next, as shown in FIG. 12, the first stress liner film 81 having a compressive stress is formed on the PMOS transistor 50P, the photoelectric conversion portion 21, and the pixel transistor portion 14. The first stress liner film 81 is formed of a silicon nitride film having a compressive stress by a plasma CVD method. The thickness of this silicon nitride film is set in the range of 10 to 100 nm.

For this plasma CVD method, monosilane ($SiH_4$) and ammonia ($NH_3$) are used as starting material gases. In addition, the temperature of the substrate for film formation is set to 400 to 500° C., the pressure of a film formation atmosphere is set to 0.27 kPa, the flow rate of monosilane ($SiH_4$) is set to 100 $cm^3$/min, the flow rate of ammonia is set to 100 $cm^3$/min, and an RF power is set to 50 to 100 W. By this CVD method, as a silicon nitride film containing a large number of nitrogen-hydrogen (N—H) bonds, the silicon nitride film described above is formed.

Subsequently, by a lithography technique and an etching technique, patterning is performed so that the silicon nitride film is allowed to remain only on the pixel portion 13 and the PMOS transistor 50P of the peripheral circuit portion 15.

As described above, the first stress liner film 81 is formed from the remaining silicon nitride film described above. For example, when the first stress liner film 81 is formed to have a thickness of approximately 20 to 100 nm, its internal stress is approximately −1.5 to −2.5 GPa.

By the first stress liner film 81, the compressive stress is applied to the channel region of the PMOS transistor 50P of the peripheral circuit portion 15, and the mobility of a hole is increased, so that a high speed PMOS transistor 50P can be realized.

Subsequently, by performing a heat treatment, hydrogen (H) is released from the first stress liner film 81 made of the silicon nitride film and is diffused to the photodiode 22 and the pixel transistor portion 14, so that defects, such as dangling bonds, are compensated for. As a result, the generation of electrons (white spots) of the photodiode 22 and/or the generation of noise of the photodiode 22 and the pixel transistor portion 14 can be suppressed. In addition, although the sidewall forming film 71 is formed on the photodiode 22, its thickness is very small, such as approximately 10 to 20 nm; hence, hydrogen is diffused through this sidewall forming film 71.

In addition, the first stress liner film 81 may also be a silicon nitride film which is formed by a plasma CVD method using tetramethylsilane and ammonia as starting material gases. In the silicon nitride film formed by the film forming method as described above, since the film density can be increased, the compressive stress applied to the channel region of the PMOS transistor 50P by the first stress liner film 81 can be increased.

Figure 15:
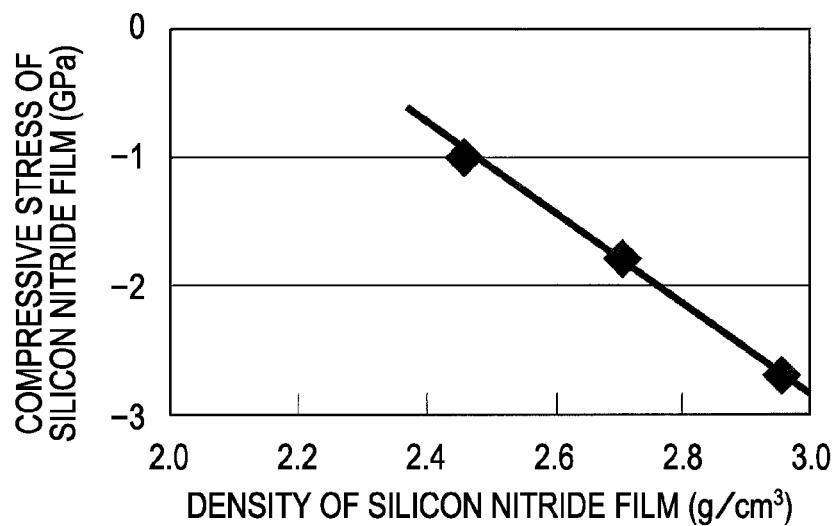
FIG. 15 is a graph showing the relationship between the internal stress (compressive stress) and the film density of a silicon nitride film.

For example, as shown in FIG. 15, the internal stress (compressive stress) and the film density of the silicon nitride film have a proportional relationship, and hence as the firm density is increased, the compressive stress is increased.

[Formation of the Second Stress Liner Film]

Figure 13:
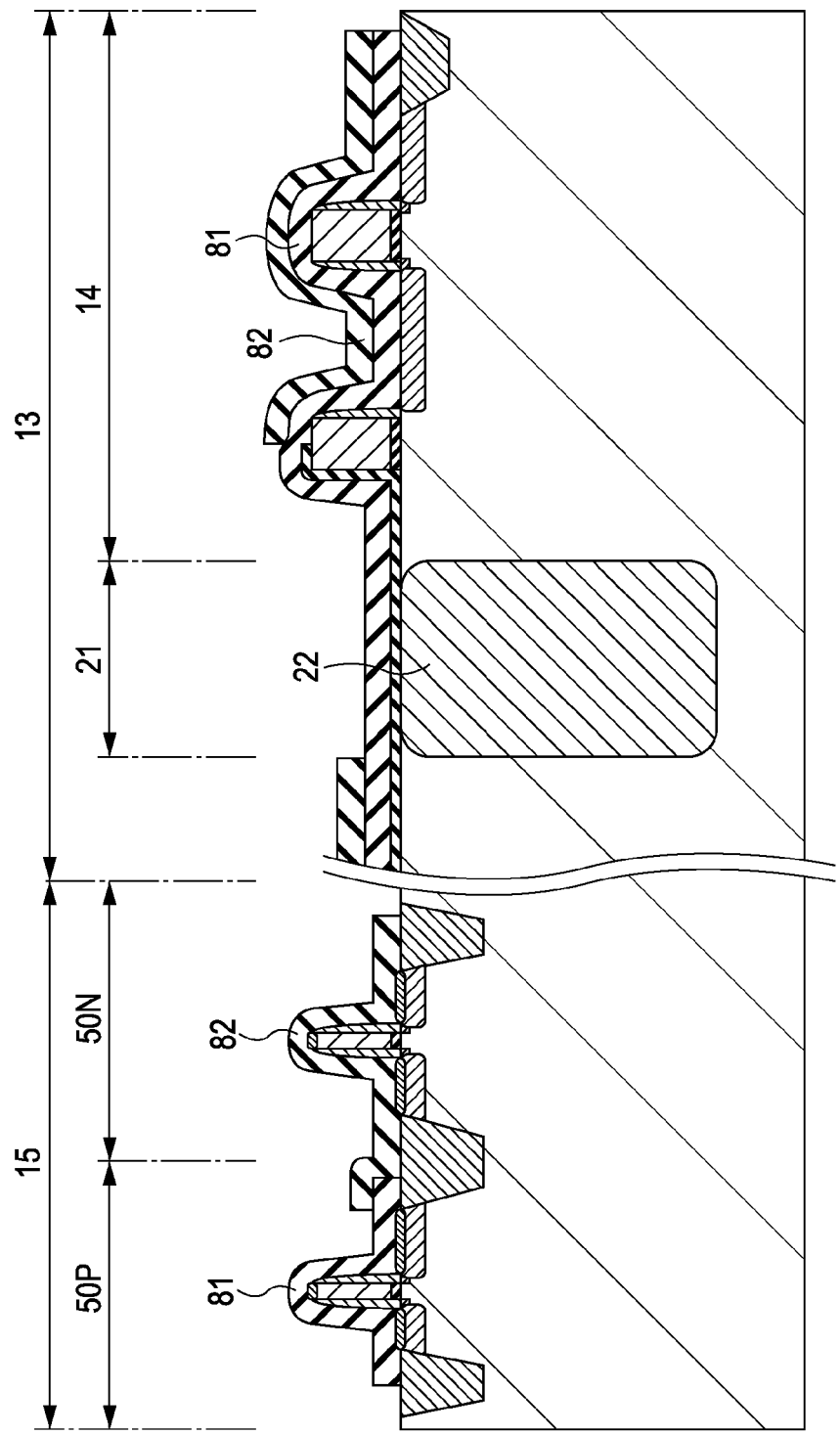
FIG. 13 is a cross-sectional view showing the first example of the method for manufacturing a solid-state image device according to the second embodiment.

Next, as shown in FIG. 13, the second stress liner film 82 having a tensile stress is formed on the NMOS transistor 50N and the pixel transistor portion 14 by using, for example, a silicon nitride film. The second stress liner film 82 is formed of a silicon nitride film having a tensile stress by a plasma CVD method. The thickness of this silicon nitride film is set in the range of 10 to 100 nm.

For this plasma CVD method, monosilane ($SiH_4$), nitrogen ($N_2$), and ammonia ($NH_3$) are used as starting material gases. In addition, the temperature of the substrate for film formation is set to 400 to 500° C., and the pressure of a film formation atmosphere is set to 1.3 kPa. In addition, the flow rate of monosilane ($SiH_4$) is set to 30 $cm^3$/min, the flow rate of nitrogen ($N_2$) is set to 100 $cm^3$/min, the flow rate of ammonia is set to 100 $cm^3$/min, and an RF power is set to 10 to 30 W.

Subsequently, by a lithography technique and an etching technique, patterning is performed so that the silicon nitride film is allowed to remain only on the pixel transistor portion 14 and the NMOS transistor 50N of the peripheral circuit portion 15.

As described above, the second stress liner film 82 is formed from the remaining silicon nitride film described above. For example, when the second stress liner film 82 is formed to have a thickness of approximately 20 to 100 nm, its internal stress is approximately 1.0 to 2.0 GPa.

By the second stress liner film 82, the tensile stress is applied to the NMOS transistor 50N of the peripheral circuit portion 15, and the mobility of an electron is increased, so that a high speed NMOS transistor 50N can be realized.

In addition, the stress of the first stress liner film 81 is counterbalanced with that of the second stress liner film 82 on each of the individual transistors of the pixel transistor portion 14, so that the state in which no stress is applied to each transistor or the state in which even if a stress is applied thereto, no adverse influence is generated can be obtained. The individual transistors are, for example, a transfer transistor (transfer gate), a reset transistor, an amplifying transistor, and a selection transistor.

In addition, when a thick silicon nitride (SiN) film is formed on the photodiode 22 of the photoelectric conversion portion 21, light absorption occurs, and the sensitivity is degraded; however, since the second stress liner film 82 is removed, the degradation in sensitivity can be suppressed.

After the second stress liner film 82 is formed, ultraviolet (UV) curing is preferably performed thereon. Since the content of hydrogen in the second stress liner film 82 can be decreased by UV curing, the film stress (tensile stress) can be further increased.

Figure 16:
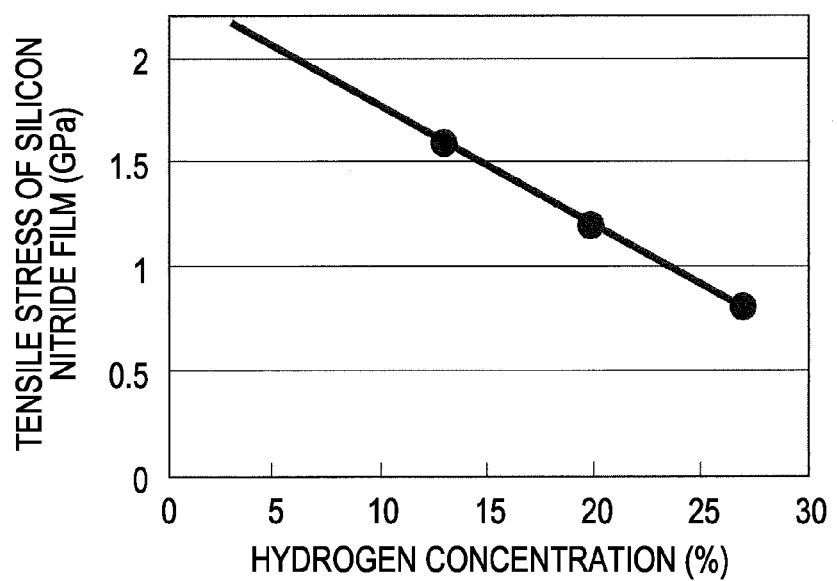
FIG. 16 is a graph showing the relationship between the internal stress (tensile stress) and the hydrogen concentration of a silicon nitride film.

For example, as shown in FIG. 16, the internal stress (tensile stress) and the hydrogen concentration of the silicon nitride film have a proportional relationship, and hence as the hydrogen concentration is decreased, the tensile stress is increased. The vertical axis of FIG. 16 indicates the tensile stress (GPa) of the silicon nitride film, and the horizontal axis indicates the ratio per unit volume, on a percentage basis, of the number of hydrogen atoms to the total numbers of Si, N, and H atoms.

[Formation of the Interlayer Insulating Film, the Wires, and the Like]

Figure 14:
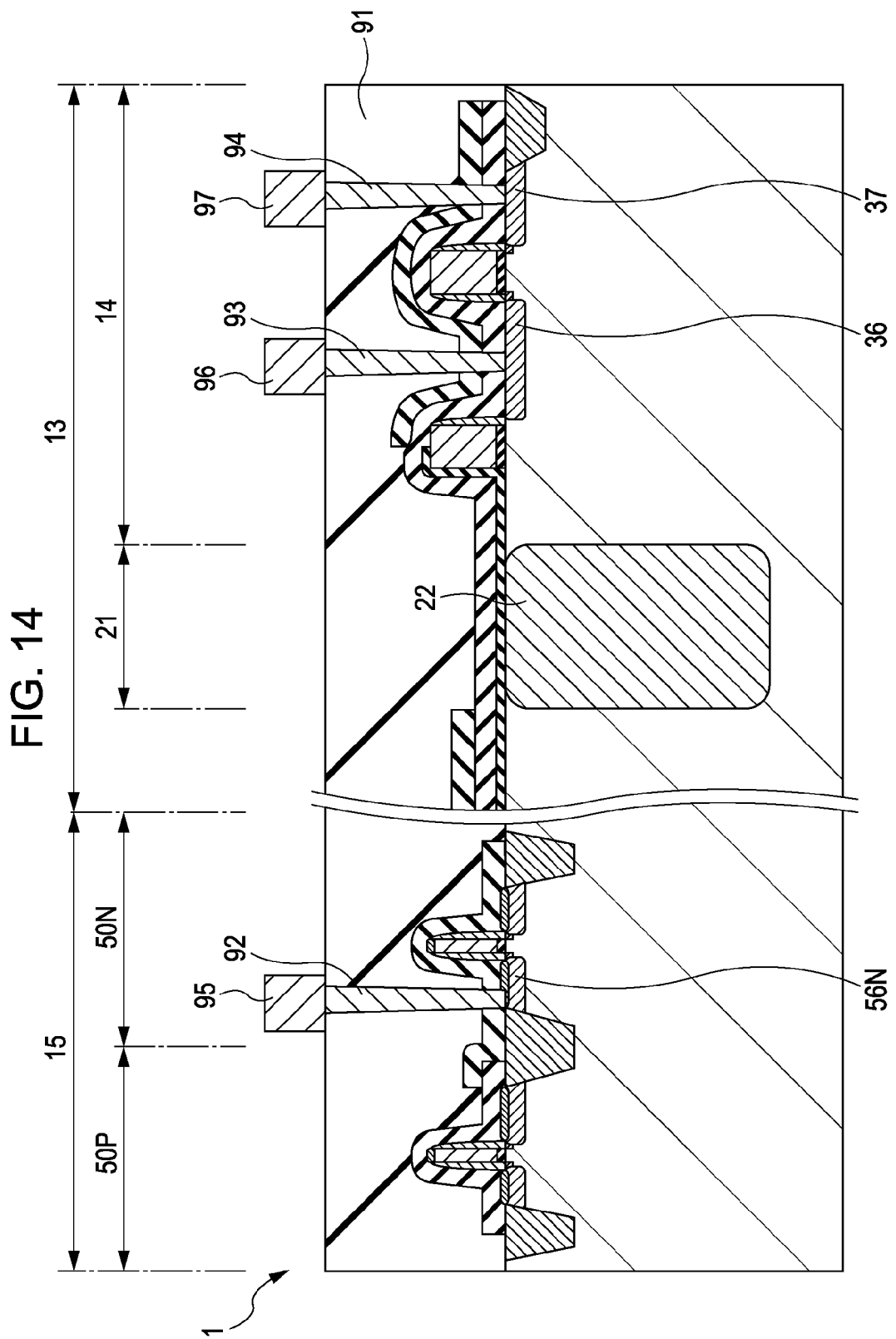
FIG. 14 is a cross-sectional view showing the first example of the method for manufacturing a solid-state image device according to the second embodiment.

Next, as shown in FIG. 14, the interlayer insulating film 91 is formed on the peripheral circuit portion 15 and the pixel portion 13 including the pixel transistor portion 14, the photoelectric conversion portion 21, and the like. Subsequently, electrodes are formed on the predetermined source/drain regions, the gate electrodes, and the like by a general electrode forming technique. In the figure, the electrodes 92, 93, and 94 connected to the source/drain region 56N of the NMOS transistor 50N and the source/drain regions 36 and 37 of the pixel transistor portion 14, respectively, are shown by way of example. In addition, by a general wire forming technique, wires connected to the electrodes are formed. In the figure, the wires 95, 96, and 97 connected to the above electrodes 92, 93, and 94, respectively, are shown by way of example.

Subsequently, although not being shown in the figure, after a planarizing insulating film covering the wires 95, 96, and 97 are formed, a color filter layer and a microlense guiding incident light to the photodiode 22 of the photoelectric conversion portion 21 are formed, so that the solid-state image device 1 of the CMOS image sensor is obtained.

In the manufacturing method according to the first example, since the first stress liner film 81 having a compressive stress is formed on the PMOS transistor 50P, the compressive stress of the first stress liner film 81 can be applied to the channel region of the PMOS transistor 50P. Hence, the mobility of the PMOS transistor 50P is improved. In addition, since the second stress liner film 82 having a tensile stress is formed on the NMOS transistor 50N, the tensile stress of the second stress liner film 82 can be applied to the channel region of the NMOS transistor 50N. Accordingly, the mobility of the NMOS transistor 50N is improved.

Hence, the operation speed of the peripheral circuit portion 15 can be improved, and the increase in pixel number can also be realized without decreasing the operation speed.

In addition, since the compressive stress of the first stress liner film 81 and the tensile stress of the second stress liner film 82 are counterbalanced with each other on the pixel transistor portion 14, the generation of noise due the stress of the stress liner film can be suppressed. In particular, this effect is significant to the amplifying transistor of the pixel transistor portion 14. Hence, the degradation in image quality caused by noise can be suppressed, and thereby a high quality image can be obtained.

As described above, by using the stress liner technique, the increase in operation speed and the reduction in noise of the image sensor portion can be advantageously realized at the same time.

In addition, since the first stress liner film 81 made of a silicon nitride film containing hydrogen is formed on the pixel portion 13, hydrogen is supplied to the semiconductor substrate 11 of the pixel portion 13 by a subsequent heat treatment, and the effect of compensating for defects of the substrate can be expected. That is, the first stress liner film 81 contains a large number of nitrogen-hydrogen (N—H) bonds, and the hydrogen thermally diffuses and functions to terminate dangling bonds of the transistors and the photodiode 22 of the pixel portion 13. Accordingly, a low-noise transistor is realized, and the generation of white spots caused by the generation of electrons can be suppressed.

Furthermore, when the first stress liner film 81 and the second stress liner film 82 are formed, the thicknesses and the internal stresses thereof can be adjusted so that the compressive stress of the first stress liner film 81 and the tensile stress of the second stress liner film 82 are counterbalanced with each other on the pixel transistor portion 14.

[Second Example of the Method for Manufacturing a Solid-State Image Device]

A second example of the method for manufacturing a solid-state image device according to the second embodiment of the present invention will be described with reference to schematic structural cross-sectional views of FIGS. 17 and 18.

Figure 17:
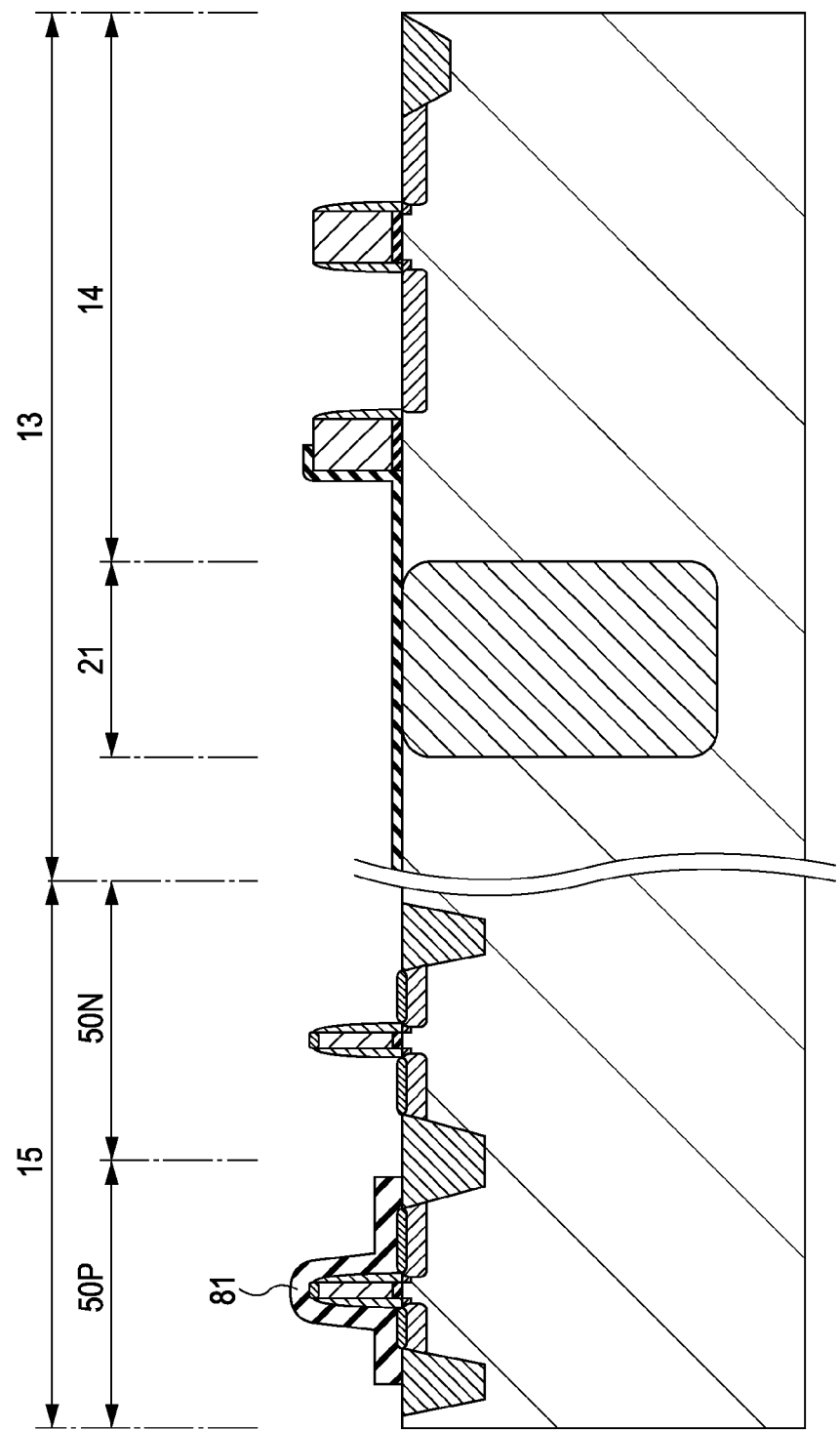
FIG. 17 is a cross-sectional view showing a second example of the method for manufacturing a solid-state image device according to the second embodiment.

In the second example of the method for manufacturing a solid-state image device, as shown in FIG. 17, the first stress liner film 81 of the first example of the manufacturing method is formed as described below. That is, the first stress liner film 81 is formed by patterning so as to cover only the PMOS transistor 50P of the peripheral circuit portion 15.

Figure 18:
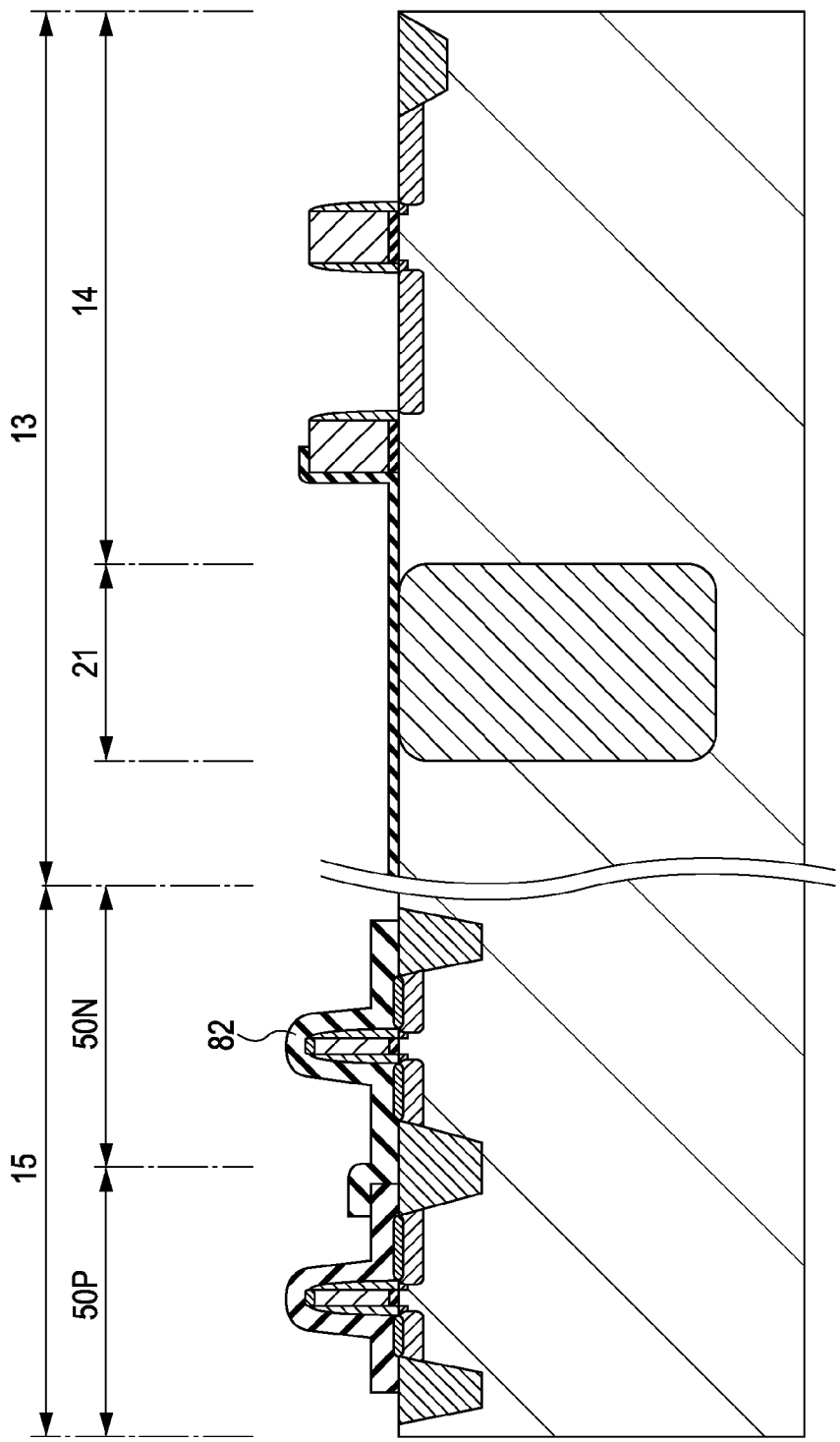
FIG. 18 is a cross-sectional view showing the second example of the method for manufacturing a solid-state image device according to the second embodiment.

In addition, as shown in FIG. 18, in the step of forming the second stress liner film 82 of the first example of the manufacturing method, the second stress liner film 82 is formed by patterning so as to cover only the NMOS transistor 50N.

The other steps are similar to those of the first example of the manufacturing method.

In the manufacturing method of the second example, as in the first example, since the mobility of the PMOS transistor 50P and that of the NMOS transistor 50N can be improved, the operation speed of the peripheral circuit portion 15 can be improved. In addition, the increase in pixel number can be realized without decreasing the operation speed.

In addition, since no stress liner film is formed on the pixel portion 13, noise caused by the stress liner film is not generated. Hence, the degradation in image quality caused by noise can be suppressed, and hence a high quality image can be obtained.

As described above, by using the stress liner technique, the increase in operation speed and the reduction in noise of the image sensor portion can be advantageously realized at the same time.

[Third Example of the Method for Manufacturing a Solid-State Image Device]

A third example of the method for manufacturing a solid-state image device according to the second embodiment of the present invention will be described with reference to schematic structural cross-sectional views of FIGS. 19 and 20.

Figure 19:
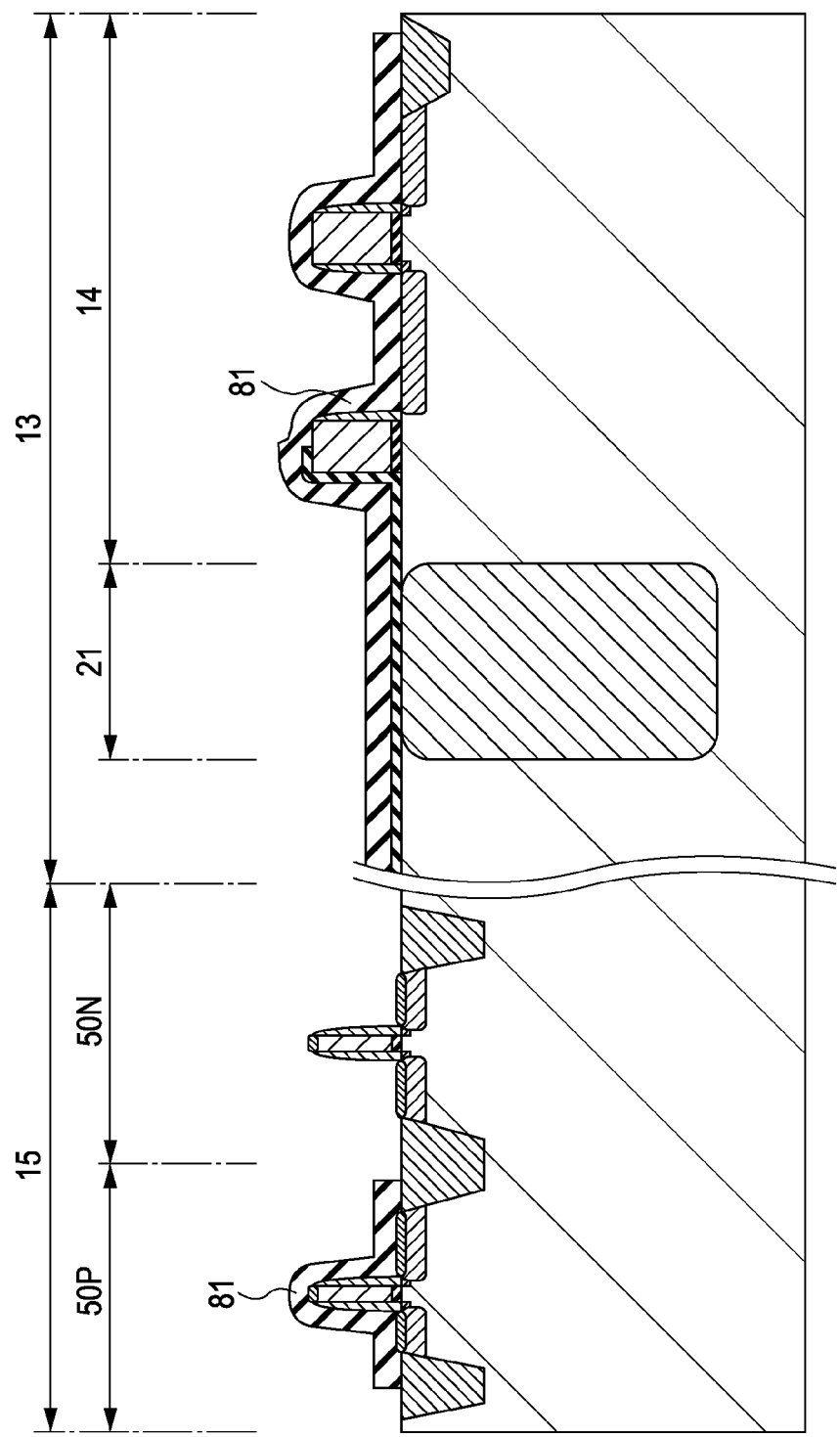
FIG. 19 is a cross-sectional view showing a third example of the method for manufacturing a solid-state image device according to the second embodiment.

In the third example of the method for manufacturing a solid-state image device, as shown in FIG. 19, the first stress liner film 81 of the first example of the manufacturing method is formed as described below. That is, the first stress liner film 81 is formed by patterning so as to cover the photoelectric conversion portion 21 and the pixel transistor portion 14 as well as the PMOS transistor 50P.

Figure 20:
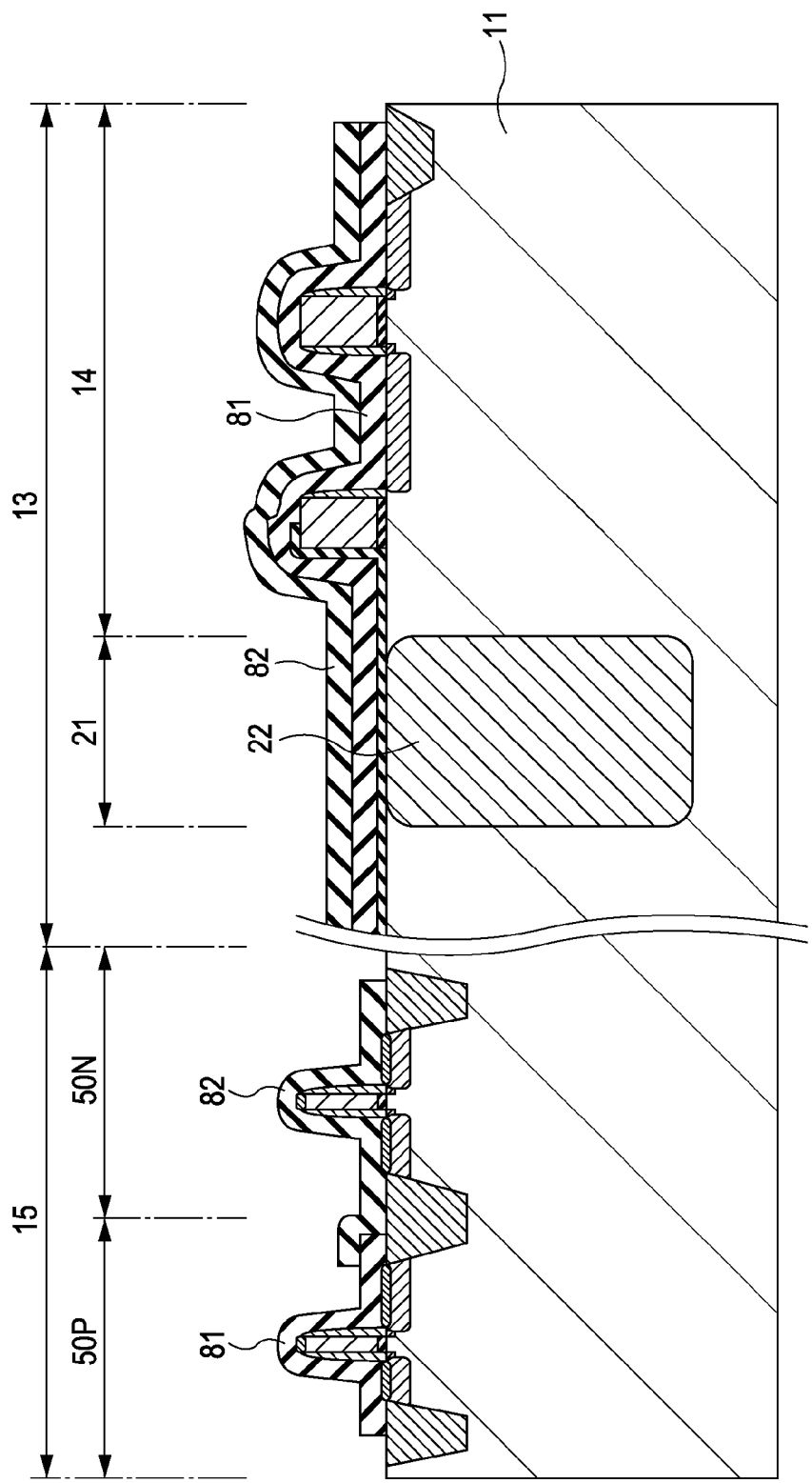
FIG. 20 is a cross-sectional view showing the third example of the method for manufacturing a solid-state image device according to the second embodiment.

In addition, as shown in FIG. 20, the second stress liner film 82 of the first example of the manufacturing method is formed as described below. That is, the second stress liner film 82 is formed on the photoelectric conversion portion 21 (photodiode 22) and the pixel transistor portion 14 as well as on the NMOS transistor 50N.

The other steps are similar to those of the first example of the manufacturing method.

In the manufacturing method of the third example, as in the first example, since the mobility of the PMOS transistor 50P and that of the NMOS transistor 50N can be improved, the operation speed of the peripheral circuit portion 15 can be improved. In addition, the increase in pixel number can be realized without decreasing the operation speed.

In addition, since the compressive stress of the first stress liner film 81 and the tensile stress of the second stress liner film 82 are counterbalance with each other on the pixel portion 13, the generation of noise caused by the stress of the stress liner film can be suppressed. Hence, the degradation in image quality caused by noise can be suppressed, and hence a high quality image can be obtained.

As described above, by using the stress liner technique, the increase in operation speed and the reduction in noise of the image sensor portion can be advantageously realized at the same time.

In addition, as in the first example, since the first stress liner film 81 made of a silicon nitride film containing hydrogen is formed on the pixel portion 13, hydrogen is supplied to the semiconductor substrate 11 of the pixel portion 13, so that the effect of compensating for defects of the substrate can be expected.

Furthermore, when the first stress liner film 81 and the second stress liner film 82 are formed, the thicknesses and the internal stresses thereof can be adjusted so that the compressive stress of the first stress liner film 81 and the tensile stress of the second stress liner film 82 are counterbalanced with each other on the pixel portion 13.

In addition, in order to decrease the attenuation of light incident on the photodiode 22, within the range in which the above effect is not degraded, the thickness of the first stress liner film 81 and that of the second stress liner film 82 laminated thereto are preferably decreased as small as possible.

[Fourth Example of the Method for Manufacturing a Solid-State Image Device]

A fourth example of the method for manufacturing a solid-state image device according to the second embodiment of the present invention will be described with reference to schematic structural cross-sectional views of FIGS. 21 and 22.

Figure 21:
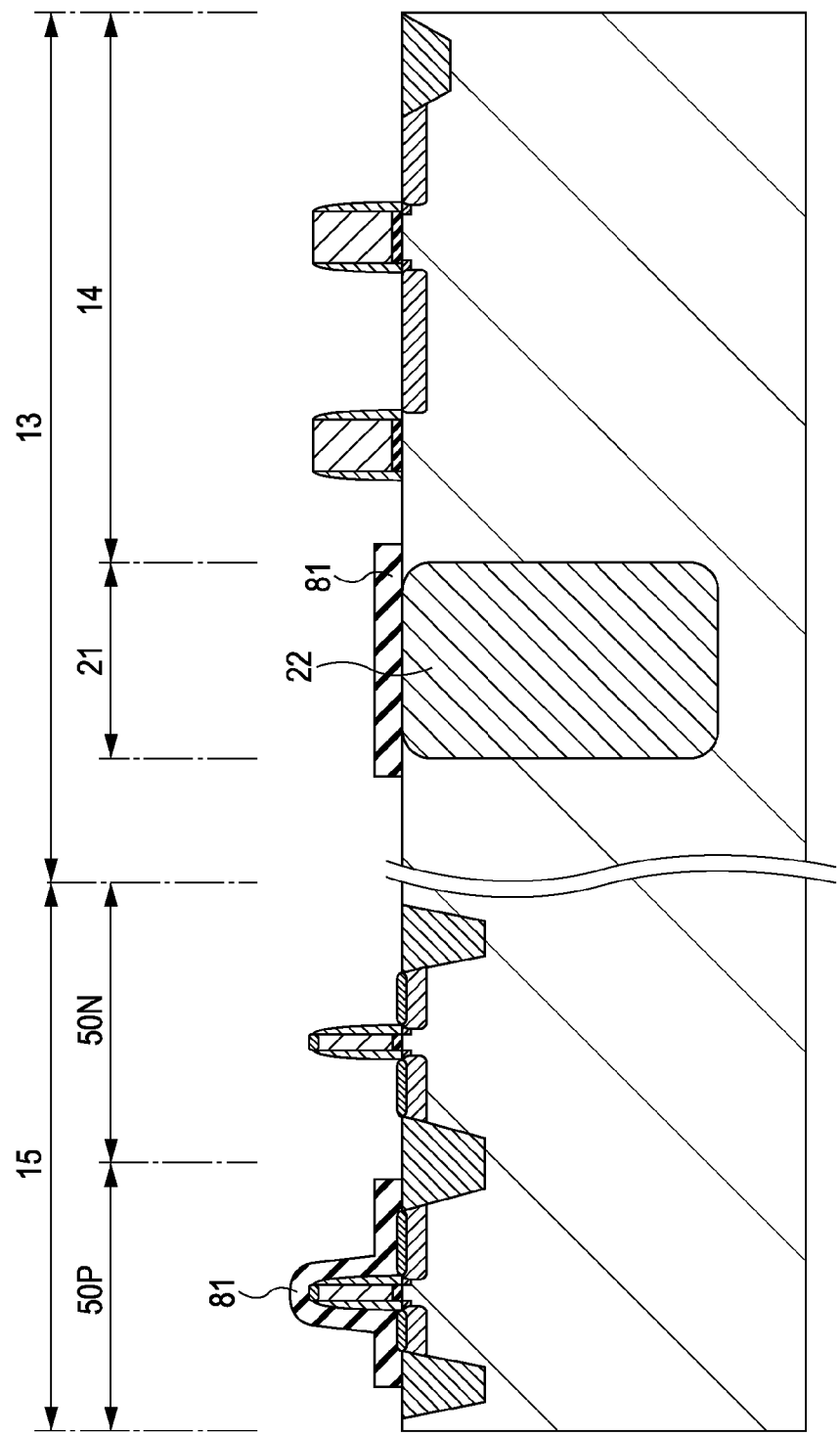
FIG. 21 is a cross-sectional view showing a fourth example of the method for manufacturing a solid-state image device according to the second embodiment.

In the fourth example of the method for manufacturing a solid-state image device, as shown in FIG. 21, the first stress liner film 81 of the first example of the manufacturing method is formed as described below. That is, the first stress liner film 81 is formed by patterning so as to cover the photodiode 22 of the photoelectric conversion portion 21 as well as the PMOS transistor 50P. At this stage, the first stress liner film 81 on the pixel transistor portion 14 is removed.

Figure 22:
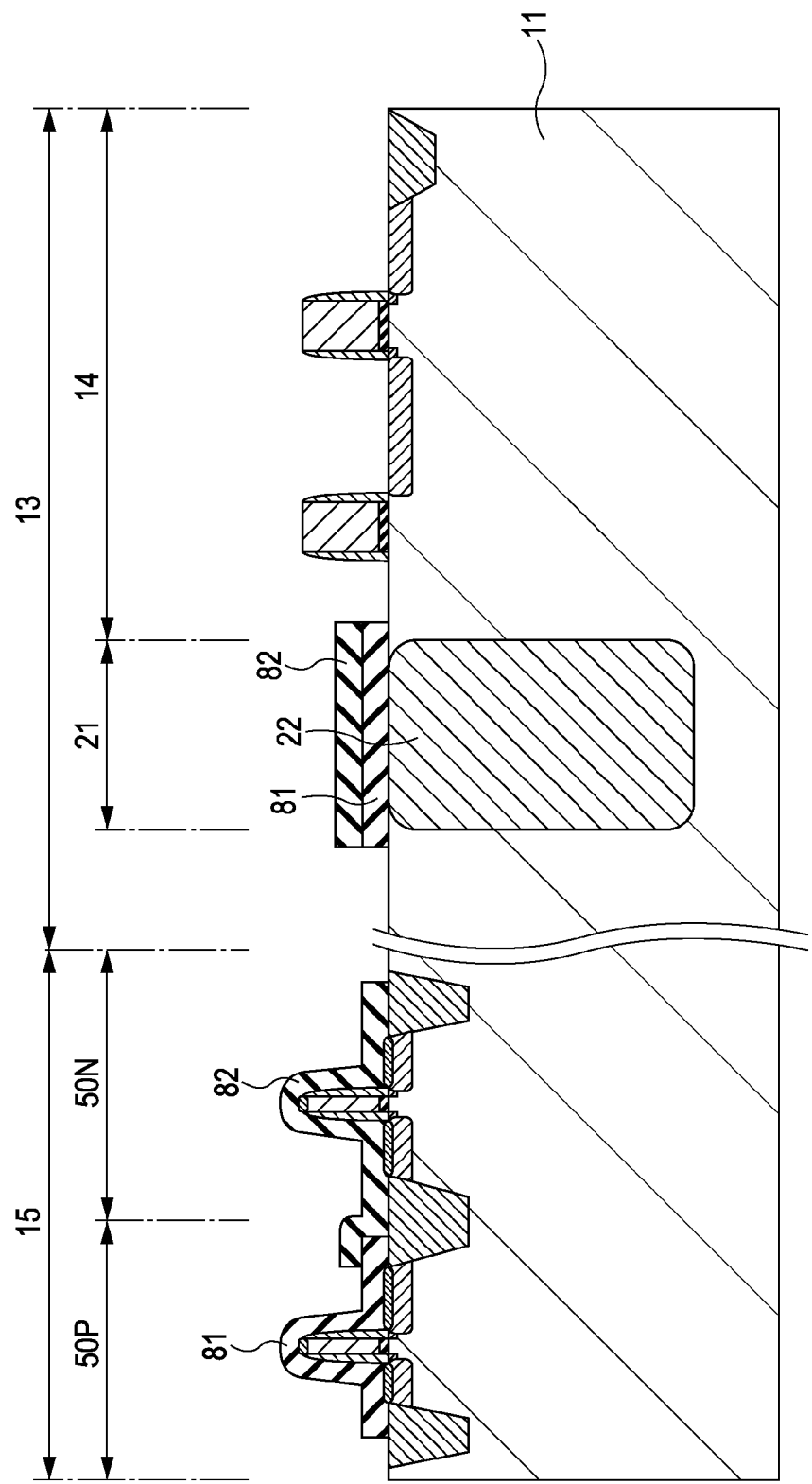
FIG. 22 is a cross-sectional view showing the fourth example of the method for manufacturing a solid-state image device according to the second embodiment.

In addition, as shown in FIG. 22, the second stress liner film 82 according to the first example of the manufacturing method is formed as described below. That is, the second stress liner film 82 is formed on the photodiode 22 of the photoelectric conversion portion 21 as well as on the NMOS transistor 50N. At this stage, the second stress liner film 82 on the pixel transistor portion 14 is removed. Hence, the first stress liner film 81 and the second stress liner film 82 are laminated to each other on the photodiode 22.

The other steps are similar to those of the first example of the manufacturing method.

In the manufacturing method according to the fourth example, as in the first example, since the mobility of the PMOS transistor 50P and that of the NMOS transistor 50N can be improved, the operation speed of the peripheral circuit portion 15 can be improved. In addition, the increase in pixel number can be realized without decreasing the operation speed.

In addition, since the generation of noise caused by the stress liner film can be suppressed, the degradation in image quality caused by noise can be suppressed, and hence a high quality image can be obtained.

As described above, by using the stress liner technique, the increase in operation speed and the reduction in noise of the image sensor portion can be advantageously realized at the same time.

In addition, as in the first example, since the first stress liner film 81 made of a silicon nitride film containing hydrogen is formed on the photodiode 22, hydrogen (H) is supplied to the semiconductor substrate 11 of the photodiode 22, so that the effect of compensating for defects of the substrate can be expected.

Furthermore, when the first stress liner film 81 and the second stress liner film 82 are formed, the thicknesses and the internal stresses thereof can be adjusted so that the compressive stress of the first stress liner film 81 and the tensile stress of the second stress liner film 82 are counterbalanced with each other on the photodiode 22.

In addition, in order to decrease the attenuation of light incident on the photodiode 22, within the range in which the above effect is not degraded, the thickness of the first stress liner film 81 and that of the second stress liner film 82 laminated thereto are preferably decreased as small as possible.

In the manufacturing method described above, when the first stress liner film 81 and the second stress liner film 82 are etched, in order to minimize etching damage done to the semiconductor substrate 11 used as an underlayer, for example, wet etching using hot phosphoric acid is preferably performed. Of course, in the case of the first example in which the first stress liner film 81 is formed as an underlayer, the second stress liner film 82 may be processed by dry etching. In addition, either wet etching or dry etching performed on the second stress liner film 82 provided on the first stress liner film 81 may be stopped, for example, by time control.

Third Embodiment

[Example of the Structure of an Image Capturing Apparatus]

An example of the structure of an image capturing apparatus according to a third embodiment of the present invention will be described with reference to a block diagram of FIG. 23. This image capturing apparatus is an apparatus which uses the solid-state image device according to an embodiment of the present invention.

Figure 23:
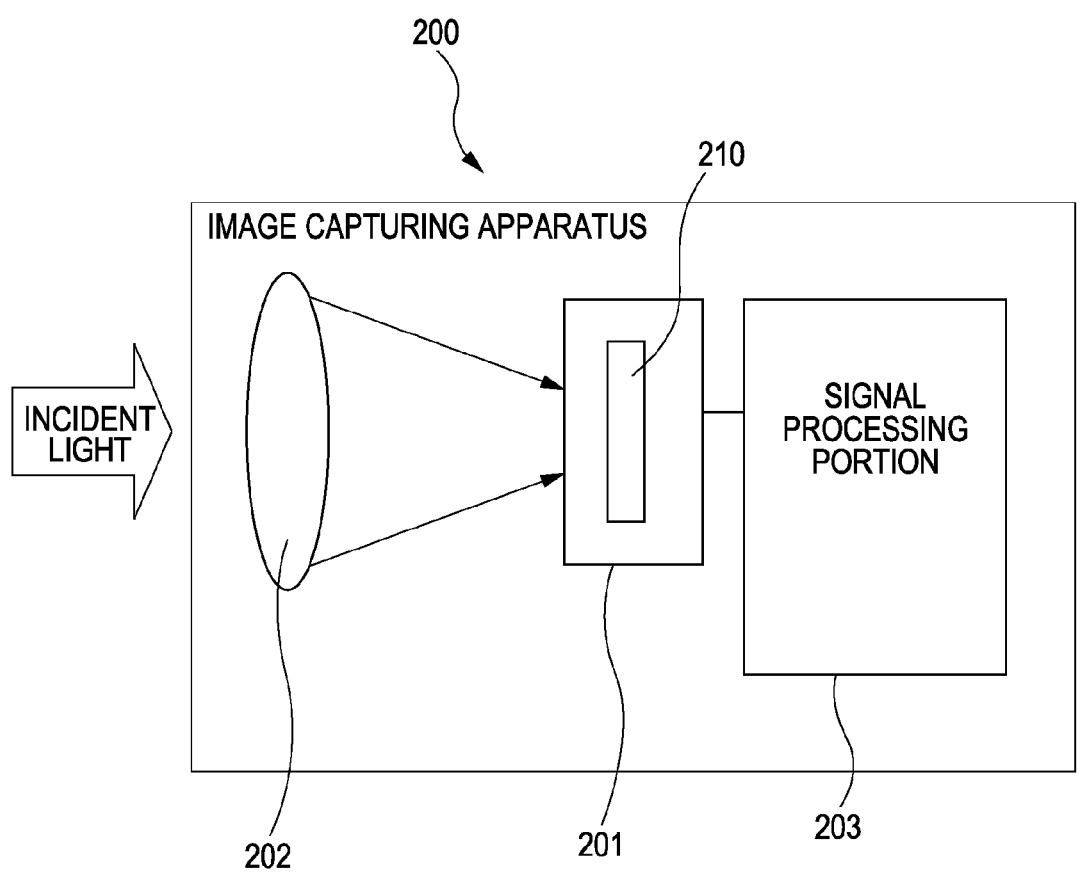
FIG. 23 is a block diagram showing one example of the structure of an image capturing apparatus according to a third embodiment of the present invention.
Figure 24A:
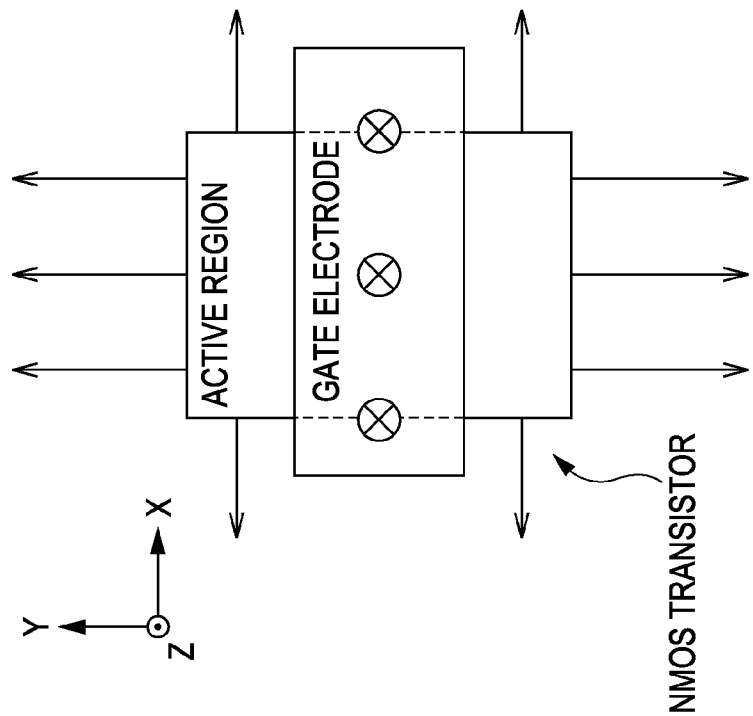
FIG. 24A is a plan layout view showing a stress direction which improves the mobility of a PMOS transistor.
Figure 24B:
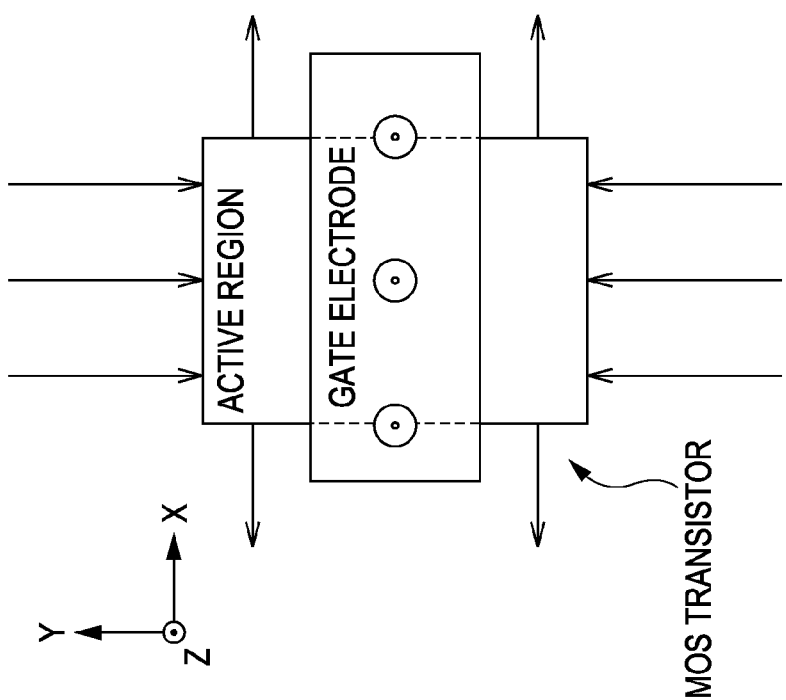
FIG. 24B is a plan layout view showing a stress direction which improves the mobility of an NMOS transistor.

As shown in FIG. 23, an image capturing apparatus 200 includes a solid-state image device 210 in an image capturing portion 201. A light condensing optical portion 202 which forms an image is provided at a light condensing side of the image capturing portion 201, and a signal processing portion 203 is connected thereto which includes, for example, a drive circuit for driving the image capturing portion 201 and a signal processing circuit for processing a signal photoelectric-converted by the solid-state image device 210 into an image. In addition, the image signal processed by the signal processing portion 203 may be stored in an image storage portion (not shown). In the image capturing apparatus 200 described above, as the solid-state image device 210, the solid-state image device 1 described in the above embodiment may be used.

In the image capturing apparatus 200 according to the third embodiment of the present invention, since the solid-state image device 1 according to an embodiment of the present invention is used, the increase in operation speed of the solid-state image device 1 and the reduction in noise of the pixel portion can be simultaneously realized, and hence a high speed operation and a high quality image can be advantageously obtained at the same time.

In addition, the image capturing apparatus 200 described above may be formed as a one-chip device or may be formed as a module having an image capturing function in which an image capturing portion and a signal processing portion or an optical system are collectively packaged. The image capturing apparatus 200 according to this embodiment indicates, for example, a camera, a mobile apparatus having an image capturing function, or the like. In addition, the "image capturing" not only indicates capturing of an image in general camera shooting but also indicates, as a wide meaning, finger print detection and the like.

The present application contains subject matter related to that disclosed in Japanese Priority Patent Application JP 2009-050131 filed in the Japan Patent Office on Mar. 4, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image device comprising:
   a photodiode configured to convert incident light into a signal charge, said photodiode being in a semiconductor substrate;
   a first stress liner film, an internal stress of the first stress liner film being a compressive stress;
   a second stress liner film, an internal stress of the second stress liner film being a tensile stress;
   a transfer region of the semiconductor substrate between said photodiode and a floating diffusion, said first stress liner film being between said floating diffusion and said second stress liner film,
   wherein said first stress liner film is a silicon nitride film, said second stress liner film being another silicon nitride film,
   wherein a surface of the semiconductor substrate is between said first stress liner film and said photodiode.

2. The solid-state image device according to claim 1, further comprising:
   p-type source/drain regions in the semiconductor substrate, said surface of the semiconductor substrate being between said first stress liner film and said p-type source/drain regions.

3. The solid-state image device according to claim 2, further comprising:
   a PMOS transistor channel region of the semiconductor substrate between said p-type source/drain regions, a PMOS transistor gate insulating film being between a PMOS transistor gate electrode and said PMOS transistor channel region.

4. The solid-state image device according to claim 1, wherein said first stress liner film is between said photodiode and said second stress liner film.

5. The solid-state image device according to claim 1, wherein said floating diffusion is in said semiconductor substrate.

6. The solid-state image device according to claim 1, further comprising:
   a transfer transistor gate insulating film between a transfer transistor gate electrode and said transfer region.

7. The solid-state image device according to claim 1, further comprising:
   n-type source/drain regions in said semiconductor substrate, said surface of the semiconductor substrate being between said second stress liner film and said n-type source/drain regions.

8. The solid-state image device according to claim 7, further comprising:
   an NMOS transistor channel region of the semiconductor substrate between said n-type source/drain regions, an NMOS transistor gate insulating film being between an NMOS transistor gate electrode and said NMOS transistor channel region.

9. The solid-state image device according to claim 1, wherein the following formula is satisfied:

$$(d1 \times P1) - (d2 \times P2) = |\Delta p| < 300 \text{ MPa, with}$$

"d1" being the thickness of the first stress liner film,
   "P1" being said internal stress of the first stress liner film,
   "d2" being the thickness of the second stress liner film,
   "P2" being said internal stress of the second stress liner film.

10. An image capturing apparatus comprising:
    an image capturing portion including the solid-state image device according to claim 1;
    a light condensing optical portion configured to condense said incident light onto said image capturing portion.

* * * * *